(12) United States Patent
Matsueda

(10) Patent No.: US 10,297,784 B2
(45) Date of Patent: May 21, 2019

(54) FOLDING TYPE DISPLAY APPARATUS AND ELECTRIC EQUIPMENT

(71) Applicant: TIANMA JAPAN, LTD., Kawasaki, Kanagawa (JP)

(72) Inventor: Yojiro Matsueda, Kawasaki (JP)

(73) Assignee: TIANMA JAPAN, LTD., Kawasaki, Kanagawa (JP)

( * ) Notice: Subject to any disclaimer, the term of this patent is extended or adjusted under 35 U.S.C. 154(b) by 0 days.

(21) Appl. No.: 15/870,484

(22) Filed: Jan. 12, 2018

(65) Prior Publication Data

US 2018/0159069 A1 Jun. 7, 2018

Related U.S. Application Data

(63) Continuation of application No. 15/484,614, filed on Apr. 11, 2017, now Pat. No. 9,905,795, which is a (Continued)

(30) Foreign Application Priority Data

Jul. 2, 2014 (JP) .................................. 2014-136685

(51) Int. Cl.
*G06F 1/16* (2006.01)
*G09F 9/30* (2006.01)
(Continued)

(52) U.S. Cl.
CPC ........ *H01L 51/5237* (2013.01); *G06F 1/1616* (2013.01); *G06F 1/1652* (2013.01);
(Continued)

(58) Field of Classification Search
CPC . H05K 1/028; H01L 27/3262; H01L 51/0097; H01L 27/1214; G06F 1/1652
See application file for complete search history.

(56) References Cited

U.S. PATENT DOCUMENTS 6,262,785 B1 7/2001 Kim
6,377,324 B1 4/2002 Katsura
(Continued)

FOREIGN PATENT DOCUMENTS

CN 203119977 U 8/2013
JP 3361820 B 1/2003
(Continued)

OTHER PUBLICATIONS

Communication dated May 29, 2018, from the Japanese Patent Office in counterpart application No. 2014-136685.
(Continued)

*Primary Examiner* — Nathan Milakovich
(74) *Attorney, Agent, or Firm* — Sughrue Mion, PLLC

(57) ABSTRACT

A folding type display apparatus, which includes a first flexible substrate including a laminate of an inorganic film and an organic film; a sheet-shaped display section formed over the first flexible substrate and having flexibility, the sheet-shaped display section including a plurality of organic electro luminescence (EL) elements and a plurality of switching elements; and a second flexible substrate including a laminate of an inorganic film and an organic film and formed over the sheet-shaped display section, wherein the first and second flexible substrates include a plurality of the laminates respectively, and the inorganic films and the organic films are alternately laminated in the plurality of laminates.

8 Claims, 39 Drawing Sheets

Related U.S. Application Data continuation of application No. 14/789,423, filed on Jul. 1, 2015, now Pat. No. 9,651,998.

(51) Int. Cl.
| | |
|---|---|
| *H05K 1/02* | (2006.01) |
| *H01L 27/32* | (2006.01) |
| *H01L 51/52* | (2006.01) |
| *H04M 1/02* | (2006.01) |
| *H01L 51/00* | (2006.01) |
| *H01L 27/12* | (2006.01) |

(52) U.S. Cl.
CPC ............ *G09F 9/301* (2013.01); *H01L 27/323* (2013.01); *H01L 27/3262* (2013.01); *H01L 27/3265* (2013.01); *H01L 51/0097* (2013.01); *H04M 1/0216* (2013.01); *H04M 1/0247* (2013.01); *H04M 1/0268* (2013.01); *H05K 1/028* (2013.01); *H01L 27/1214* (2013.01); *H01L 2251/5338* (2013.01); *H05K 2201/056* (2013.01)

(56) References Cited

U.S. PATENT DOCUMENTS

| | | | |
|---|---|---|---|
| 7,311,366 B2 | 12/2007 | Kim et al. | |
| 8,367,440 B2* | 2/2013 | Takayama | H01L 21/76251 257/E21.567 |
| 8,624,487 B2* | 1/2014 | Han | H05B 33/04 313/506 |
| 9,204,565 B1 | 12/2015 | Lee et al. | |
| 9,235,239 B2 | 1/2016 | van Dijk et al. | |
| 9,681,538 B2 | 6/2017 | Ahn | |
| 9,985,628 B2* | 5/2018 | Yamamoto | H03K 17/962 |
| 2003/0027369 A1* | 2/2003 | Yamazaki | H01L 51/003 438/21 |
| 2004/0061118 A1* | 4/2004 | Yamazaki | H01L 51/5253 257/79 |
| 2008/0013265 A1 | 1/2008 | Kim | |
| 2008/0049389 A1 | 2/2008 | Kim | |
| 2011/0286157 A1 | 11/2011 | Ma | |
| 2012/0243206 A1 | 9/2012 | Wang et al. | |
| 2012/0243207 A1 | 9/2012 | Wang et al. | |
| 2013/0010405 A1 | 1/2013 | Rothkopf et al. | |
| 2013/0021762 A1 | 1/2013 | van Dijk et al. | |
| 2013/0342094 A1 | 12/2013 | Walters et al. | |
| 2014/0008668 A1 | 1/2014 | Hirakata et al. | |
| 2014/0306864 A1 | 10/2014 | Nakamura | |
| 2015/0072124 A1* | 3/2015 | Sakaguchi | G02B 1/105 428/216 |
| 2015/0177789 A1 | 6/2015 | Jinbo | |
| 2015/0230349 A1 | 8/2015 | Lee et al. | |
| 2015/0248149 A1 | 9/2015 | Yamazaki et al. | |
| 2015/0311265 A1* | 10/2015 | Matsueda | H01L 27/3218 257/40 |
| 2015/0370287 A1 | 12/2015 | Ko et al. | |
| 2016/0035796 A1* | 2/2016 | Ikeda | G09G 3/3291 257/40 |
| 2016/0040462 A1 | 2/2016 | Nakamura | |
| 2016/0295709 A1 | 10/2016 | Ahn | |
| 2016/0302316 A1 | 10/2016 | Jeong et al. | |
| 2017/0033311 A1* | 2/2017 | Baek | H01L 51/5246 |
| 2017/0132974 A1* | 5/2017 | Matsueda | G09G 3/3233 |
| 2017/0242515 A1* | 8/2017 | Son | G06F 3/0412 |

FOREIGN PATENT DOCUMENTS

| | | |
|---|---|---|
| JP | 2006-174506 A | 6/2006 |
| JP | 2006-243127 A | 9/2006 |
| JP | 2006-287982 A | 10/2006 |
| JP | 2008-507723 A | 3/2008 |
| JP | 2010244694 A | 10/2010 |
| JP | 2014029853 A | 2/2014 |
| WO | 2014087951 A1 | 6/2014 |

OTHER PUBLICATIONS

Communication dated Jul. 17, 2018 from the Japanese Patent Office in counterpart Application No. 2014-136685.

Communication dated Sep. 4, 2018 from the State Intellectual Property Office of the P.R.C. in counterpart Application No. 201510372391.4.

\* cited by examiner

FOLDING TYPE DISPLAY APPARATUS AND ELECTRIC EQUIPMENT

CROSS-REFERENCE TO RELATED APPLICATIONS

This application is a continuation of U.S. patent application Ser. No. 15/484,614, filed Apr. 11, 2017, which is a continuation of U.S. patent application Ser. No. 14/789,423, filed Jul. 1, 2015, which claims priority to Japanese Patent Application No. 2014-136685, filed Jul. 2, 2014, the contents of all of which are incorporated herein by reference.

TECHNICAL FIELD

The present invention relates to a display apparatus and electric equipment, more specifically, to a folding type display apparatus using an organic EL element formed on a flexible substrate and electric equipment comprising the display apparatus.

BACKGROUND

An organic electro luminescence (EL) element is a current-driven type self-luminous device, which has advantages of low power consumption, high viewing angle, high contrast ratio, and the like, without a backlight, and it is considered to facilitate the ongoing development of flat panel displays.

An organic EL display apparatus using the above-described organic EL element forms a plurality of pixels by using sub-pixels of respective colors of red (R), green (G) and blue (B), and whereby displays a variety of color images thereon. As a method of displaying these color images, there are a color filter type that produces three colors of R, G and B by a color filter, and a side-by-side selective deposition type that selectively deposits organic materials of three colors of R, G and B with individually different colors, based on a white organic EL element. The color filter type has a drawback in that the color filter absorbs light, reduces the utilization rate of light, and increases power consumption, whereas the side-by-side selective deposition type is an easy means to provide a wide color gamut due to high color purity, and the utilization rate of light is increased without a color filter. For this reasons, the side-by-side selective deposition type has been widely used.

When preparing the organic EL display apparatus using the above-described side-by-side selective deposition type, commonly, a switching element such as a thin film transistor (TFT) is formed on a glass substrate, and an organic EL element is formed thereon. However, by using a flexible plastic substrate instead of the glass substrate, a flexible organic EL display apparatus may be prepared. For example, a first thin film is formed on a plastic substrate, a switching element such as a TFT is formed thereon, an organic EL element is formed thereon, and then a second thin film is formed to seal the same, thereby a flexible organic EL display apparatus may be prepared. In this case, by successfully maintaining a deformation balance between the first thin film on the substrate side and the second thin film on the sealing side, it is possible to prepare an organic EL display apparatus foldable in a curvature exceeding about 2 mm ($r>2$ mm).

As a technique relating to the above-described foldable display apparatus, for example, Japanese Patent No. 3361820 discloses, as illustrated in FIGS. 1 to 3, a structure for installing a flexible liquid crystal display panel 502 comprising: a foldable-formed liquid crystal display panel installation member 501; and the flexible liquid crystal display panel 502 installed across a folding portion of the liquid crystal display panel installation member 501, wherein a bending part 502a is formed in the flexible liquid crystal display panel 502 during folding of the liquid crystal display panel installation member 501. In this structure, the vicinity of the bending part 502a of the flexible liquid crystal display panel 502 is configured to be free to the liquid crystal display panel installation member 501, and into a relief-groove part 503, which is formed on at least one surface of opposite surfaces, the bending part 502a is entered in the vicinity of the folding portion during folding of the liquid crystal display panel installation member 501.

In addition, Japanese Patent Laid-Open Publication No. 2006-287982 discloses, as illustrated in FIGS. 4 to 7, a structure which includes at least two substantially flat plate-shaped housings 511A and 511B, wherein the two flat plate-shaped housings 511A and 511B are connected to each other by a first connection means (hinge part) 513 in such a manner that, when these housings are bent toward each other, the respective flat surfaces thereof are opposed to each other with being separated from each other by as much as a thickness dimension of an electronic circuit housing 512, and the electronic circuit housing 512 and one housing of the flat plate-shaped housings 511A and 511B are connected to each other by a second connection means (hinge part) 514 in such a manner that, when the two flat plate-shaped housings 511A and 511B are mutually folded, the electronic circuit housing 512 is installed between the respective flat surfaces thereof.

Further, Japanese Unexamined Patent Application Publication No. 2008-507723 discloses, as illustrated in FIGS. 8 and 9, a portable display apparatus comprising: at least two or more panel housings 522 on which displays 521 are mounted; a folding type connection means 523 for connecting the panel housings 522; a circuit connection line which is mounted on the panel housings 522 to connect circuits of the displays 521; and a cover means 524 which cover the circuit connection line so as not to be exposed to an outside.

Further, Japanese Patent Laid-Open Publication No. 2006-174506 discloses, as illustrated in FIGS. 10 to 12, a portable communication terminal comprising: a substantially rectangular flexible display 531 having one bendable visible screen; a support housing group including two or more substantially flat plate-shaped support housings 532 connected to each other so as to be juxtaposed laterally as seen from a user; a substantially flat plate-shaped communication terminal housing (portable telephone housing) 533 connected to a right or left end part of the support housing group as seen from the user and including at least a wireless communication section, a voice input section and a voice output section; and a connection means (bending part) 534 which connects the communication terminal housing 533 to the support housing 532 adjacent thereto so as to be bent in a rear direction of the support housing 532 and so as to be folded with respect to the support housing 532.

SUMMARY

Japanese Patent No. 3361820 discloses, as illustrated in FIGS. 1 to 3, a structure in which the relief-groove part 503 into which the bending part 502a of the flexible liquid crystal display panel 502 is entered in the vicinity of a connection means 501a of the two liquid crystal display panel installation members 501 is formed (a so-called "counter bore" is formed), thereby securing a curvature of the flexible liquid crystal display panel 502. However, in this structure, the liquid crystal display panel installation member 501 is thicker due to forming the relief-groove part 503, and thereby, due to an increase in the weight, it is not suitable for mobile applications which require thinness and lightweight. Further, Japanese Patent No. 3361820 discloses several structures for reinforcing the flexible liquid crystal display panel when the liquid crystal display panel installation member is opened. However, since all structures partially reinforce the bending part of the flexible liquid crystal panel, when providing a function of a touch panel to the flexible liquid crystal display panel, it is difficult to detect a touch on the bending part, and thereby touch operability is deteriorated.

In addition, Japanese Patent Laid-Open Publication No. 2006-287982 discloses, as illustrated in FIGS. 4 to 7, a structure in which a flexible display 515 extends over the two substantially flat plate-shaped housings 511A and 511B, and during folding, the electronic circuit housing 512 is disposed between the two flat plate-shaped housings 511A and 511B, thereby securing the curvature of the flexible display 515. However, in this structure, the entire apparatus is thicker due to the electronic circuit housing disposed between the two flat plate-shaped housings 511A and 511B, thereby leading to an increase in the weight. It is not suitable for mobile applications which require thinness and lightweight.

Further, Japanese Unexamined Patent Application Publication No. 2008-507723 discloses, as illustrated in FIGS. 8 and 9, a structure of connecting two or more panel housings 522 on which the displays 521 are mounted by the folding type connection means 523. However, there is no detailed description for how to secure the curvature of the displays 521 by the folding type connection means 523. Further, Japanese Patent Laid-Open Publication No. 2006-174506 discloses, as illustrated in FIG. 10 to 12, a flexible display 531 having three-folding and four-folding structures. However, there is also no detailed description for how to secure the curvature of the flexible display 531 by a hinge part 535 for the support housings 532.

In consideration of the above-mentioned circumstances, it is an object of the present invention to provide a folding type display apparatus capable of appropriately securing a curvature of a display section while controlling an increase in a thickness and weight of the apparatus with the apparatus being folded, and successfully maintaining touch operability of a folding portion of the display section with the apparatus being opened, and electric equipment comprising the folding type display apparatus.

In addition, another object of the present invention is to provide a folding type display apparatus capable of improving touch operability by configuring the apparatus to be appropriately held with the apparatus being opened, and electric equipment comprising the folding type display apparatus.

According to one aspect of the present invention, there is provided a folding type display apparatus, comprising: a sheet-shaped display section having flexibility; and a plurality of housings which hold the sheet-shaped display section, wherein the plurality of housings include a first housing which has a cross section of a channel shape with a space formed therein, and a plate-shaped second housing and a plate-shaped third housing which are bendably connected to both ends of the first housing in a direction being separated from each other, the display apparatus further comprises a holding member which is held in the second and/or the third housing, the sheet-shaped display section is fixed to the second housing and the third housing so as to be folded on a side of the first housing, in a closed state of the second housing and the third housing, a folding portion of the display section is housed in the space formed by the first housing, in an open state of the second housing and the third housing away from each other to form the flat display section, and the first housing functions as a leg which protrudes from flat surfaces of the second housing and the third housing to a back side, and the holding member connects the second housing and the third housing, fixes the second housing and the third housing to each other, and supports the folding portion of the display section.

According to another aspect of the present invention, there is provided electric equipment comprising: the above-described folding type display apparatus; and a second display section provided on a surface opposite to a surface to which the display section is fixed.

According to the present invention, it is possible to appropriately secure a curvature of the display section while controlling an increase in the thickness and weight of the apparatus with the apparatus being folded, and successfully maintaining touch operability of the folding portion of the display section with the apparatus being opened. In addition, it is possible to improve touch operability by allowing the apparatus to be appropriately held with the apparatus being opened.

The reason for this is that: the folding type display apparatus comprises the sheet-shaped display section having flexibility, and the plurality of housings which can hold the display section in an open or closed state; the plurality of housings include the first housing which has a cross section of a channel shape forming the space therein, and the plate-shaped second housing and the plate-shaped third housing which are bendably connected to both ends of the first housing in an opposite direction, and the display section is fixed to the second housing and the third housing, thereby in the closed state of the second housing and the third housing, the folding portion of the display section is stored in the space formed by the first housing, and in the open state of the second housing and the third housing away from each other to form the flat display section; and the folding portion of the display section is held in the space by the holding member inserted into the space formed by the first housing, such that the first housing functions as a handle of the folding type display apparatus.

Thereby, it is possible to secure the curvature of the display section by necessary minimum members, and sufficiently secure strength by the holding member when the apparatus is opened, such that the folding type display apparatus that can perform the touch operation by one hand may be realized without bending the second and third housings.

The above and further objects and features will more fully be apparent from the following detailed description with accompanying drawings.

DETAILED DESCRIPTION

Figure 1:
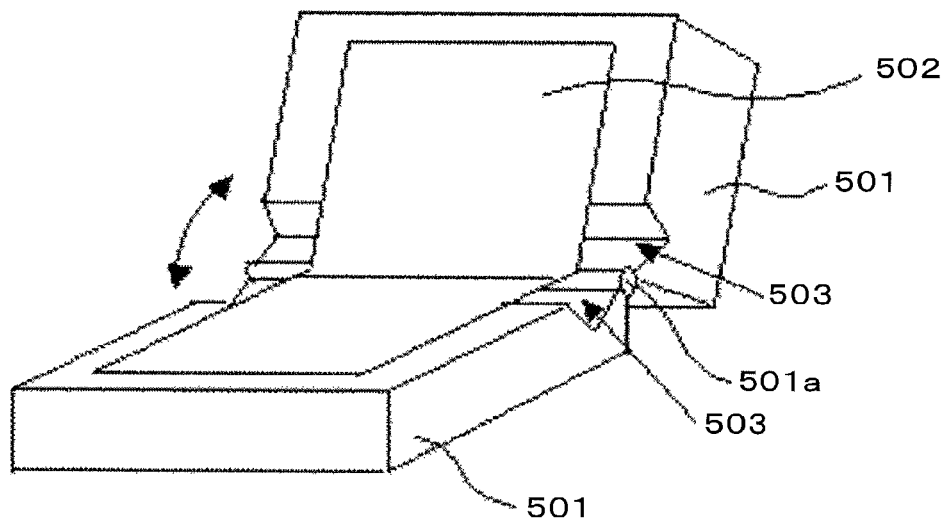
FIG. 1 is a perspective view illustrating a structure (in an open state) of a display apparatus of Japanese Patent No. 3361820.
Figure 2:
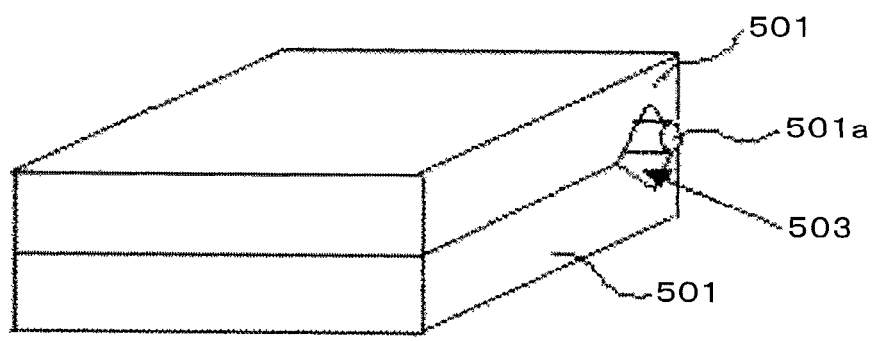
FIG. 2 is a perspective view illustrating the structure (in a closed state) of the display apparatus of Japanese Patent No. 3361820.
Figure 3:
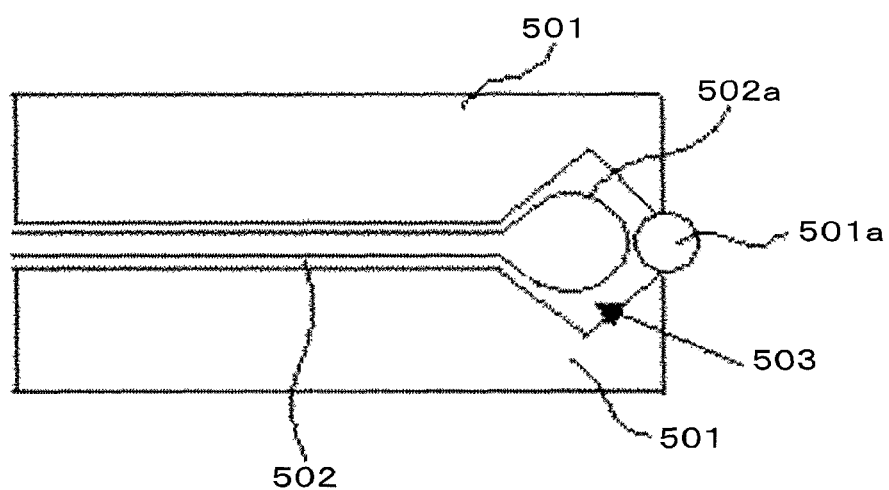
FIG. 3 is a side view illustrating the structure (in the closed state) of the display apparatus of Japanese Patent No. 3361820.
Figure 4:
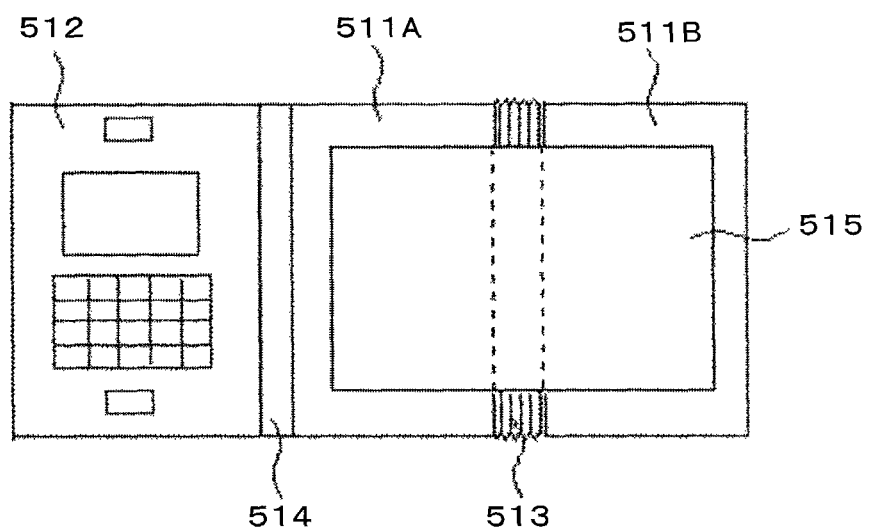
FIG. 4 is a plan view illustrating a structure (in the open state) of a display apparatus of Japanese Patent Laid-Open Publication No. 2006-287982.
Figure 5:
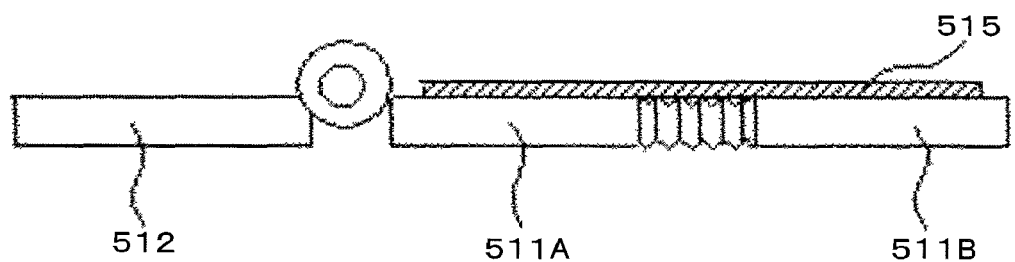
FIG. 5 is a side view illustrating the structure (in the open state) of the display apparatus of Japanese Patent Laid-Open Publication No. 2006-287982.
Figure 6:
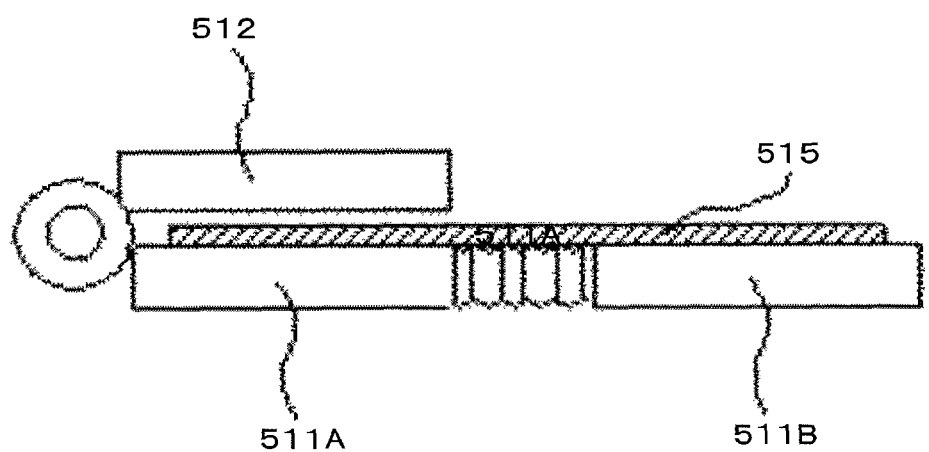
FIG. 6 is a side view illustrating the structure (in the closed state of an electronic circuit housing) of the display apparatus of Japanese Patent Laid-Open Publication No. 2006-287982.
Figure 7:
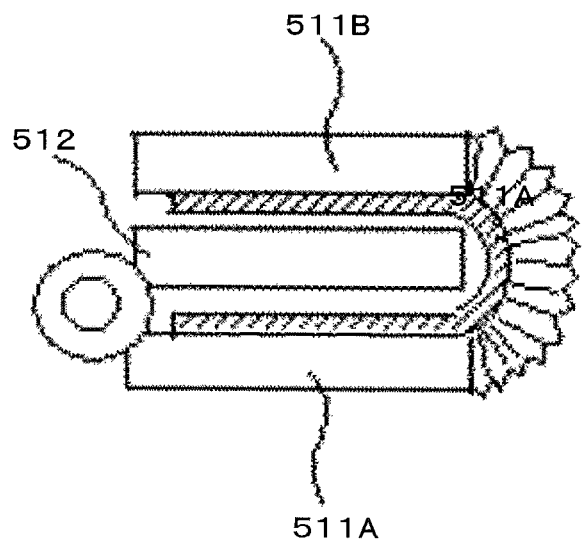
FIG. 7 is a side view illustrating the structure (in a further folded state of substantially flat plate-shaped housings 511A and 511B) of the display apparatus of Japanese Patent Laid-Open Publication No. 2006-287982.
Figure 8:
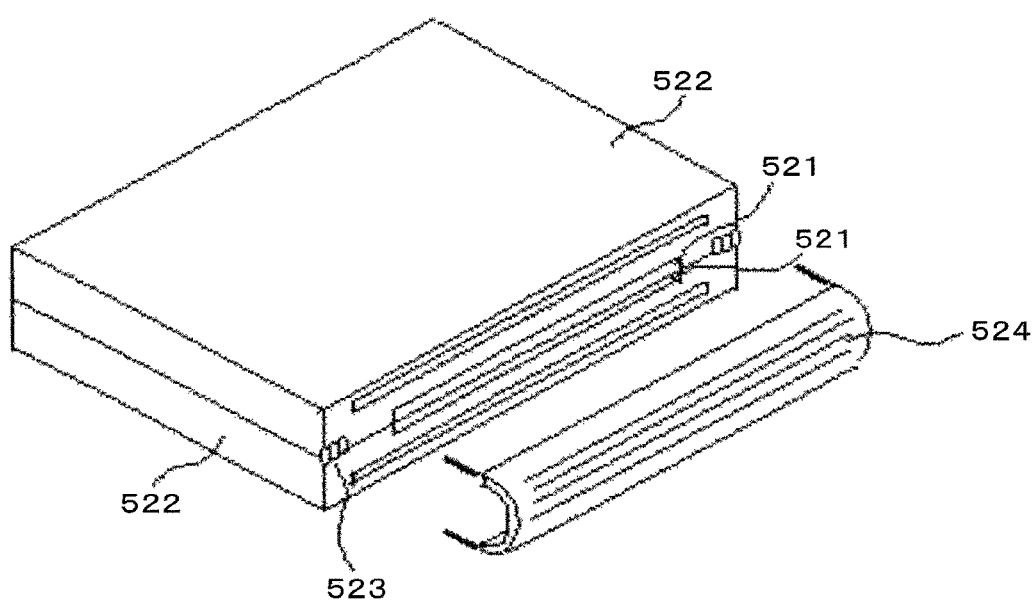
FIG. 8 is a perspective view illustrating a structure (in the closed state) of a display apparatus of Japanese Unexamined Patent Application Publication No. 2008-507723.
Figure 9:
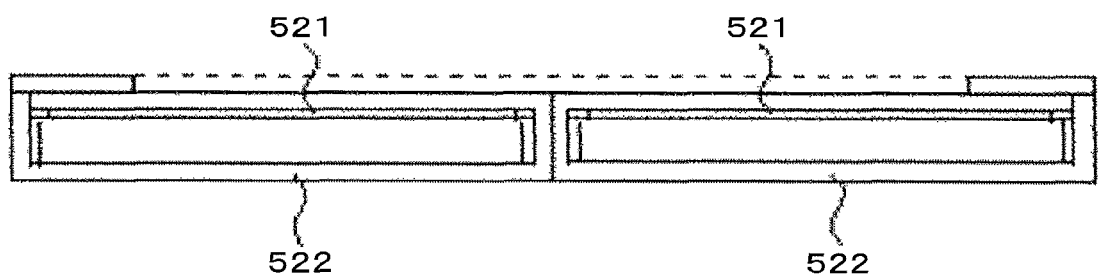
FIG. 9 is a side cross-sectional view illustrating the structure (in the open state) of the display apparatus of Japanese Unexamined Patent Application Publication No. 2008-507723.
Figure 10:
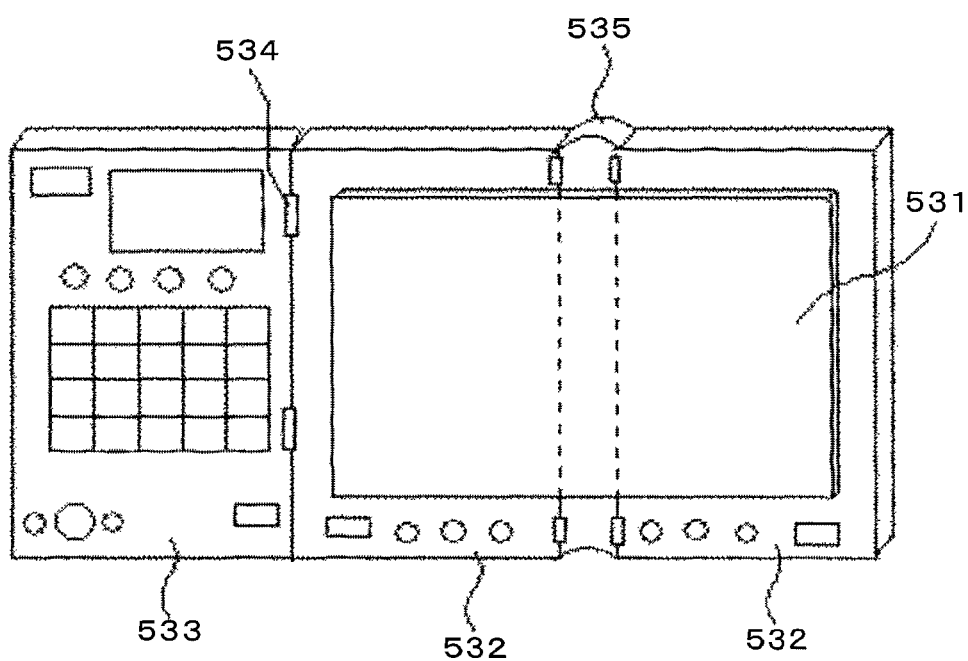
FIG. 10 is a perspective view illustrating a structure (in the open state) of a display apparatus of Japanese Patent Laid-Open Publication No. 2006-174506.
Figure 11:
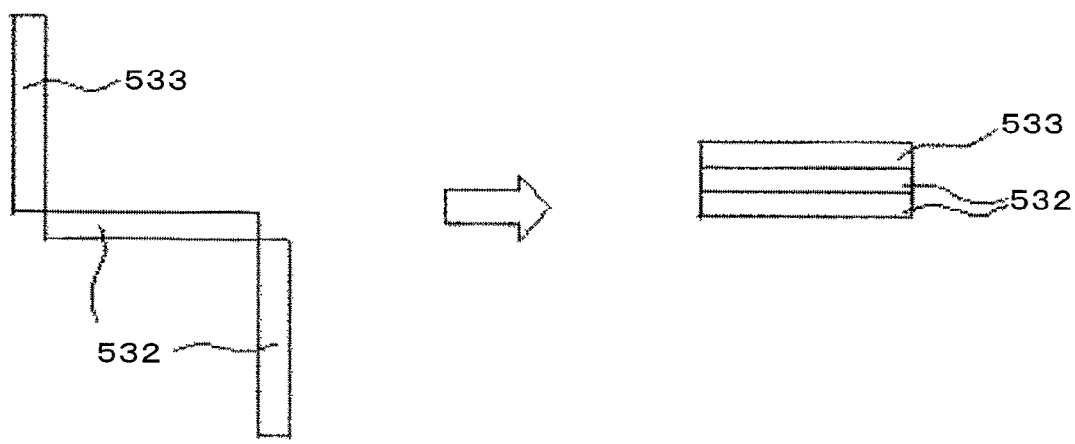
FIG. 11 is a side view illustrating an example of the structure (structure in which three housings are folded) of the display apparatus of Japanese Patent Laid-Open Publication No. 2006-174506.
Figure 12:
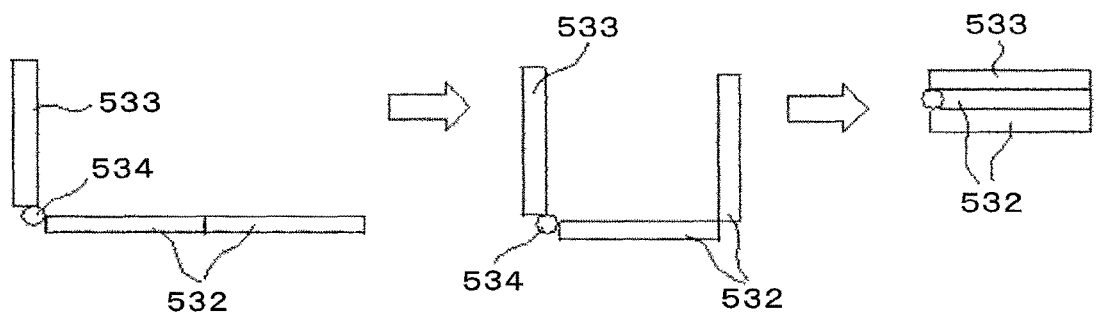
FIG. 12 is a side view illustrating another example of the structure (structure with three housings being folded) of the display apparatus of Japanese Patent Laid-Open Publication No. 2006-174506.

As described in the background, various display apparatus having a folding structure have been proposed in the art.

However, in the structures as described in Japanese Patent No. 3361820 and Japanese Patent Laid-Open Publication No. 2006-287982, the apparatuses are thicker and heavier, and are not suitable for mobile applications which require thinness and lightweight, and in the structure described in the Japanese Patent No. 3361820, it is not possible to secure touch operability of the entire folding part. In addition, in also Japanese Unexamined Patent Application Publication No. 2008-507723 and Japanese Patent Laid-Open Publication No. 2006-174506, two-folding and three-folding structures are disclosed, however there is no detailed description for the connection portion, and it is not possible to maintain the curvature of the display only by the simple bending. Further, in Japanese Patent No. 3361820, Japanese Patent Laid-Open Publication No. 2006-287982, Japanese Unexamined Patent Application Publication No. 2008-507723 and Japanese Patent Laid-Open Publication No. 2006-174506, there is no description for easily holding the apparatus.

Therefore, in one embodiment of the present invention, a plurality of housings that can hold a sheet-shaped display section having flexibility (hereinafter, also referred to as a 'flexible display section') in an open state and closed state includes a first housing which has a cross section of a U shape or an open square shape with a space formed therein, and a plate-shaped second housing and a plate-shaped third housing which are bendably connected to both ends of the first housing in an opposite direction. In addition, in a closed state of the second housing and the third housing (in a state in which the flexible display section is folded), a folding portion of the flexible display section is housed in the space formed by the first housing, thereby a curvature of exceeding 2 mm (radius: r>2 mm) that can maintain the function of the flexible display section is secured. Further, in an open state of the second housing and the third housing away from each other (in a state in which the flexible display section is in a flat unfolded state), a holding member for connecting the second housing and the third housing is disposed (for example, the holding member housed in the second housing is inserted into the third housing by sliding the same), so that the second and third housings are fixed to each other and a folding portion of the flexible display section is supported, by the holding member, thereby the touch operability is improved. Furthermore, in the open state, the first housing functions as a handle which protrudes from the flat surface of the second and third housings to a back side, such that the display apparatus is easily held, and the touch operability is improved.

Hereinafter, the present invention will be described in detail with reference to the accompanying drawings. Herein, an electro-optic element refers to a general electronic element in which the optical state of light is changed by an electrical action, and includes an electronic element such as a liquid crystal element which displays an image with gradation by changing a polarized state of light, in addition to a self-luminous element such as an organic EL element or the like. In addition, an electro-optical device is a display apparatus which displays an image using the electro-optical element. In the present invention, the organic EL element is preferably employed, and by using the organic EL element, it is possible to obtain a current-driven light emitting element which self-emits light by the current driving. In this regard, hereinafter, the present invention will be described with respect to the organic EL element as an example.

Figure 13:
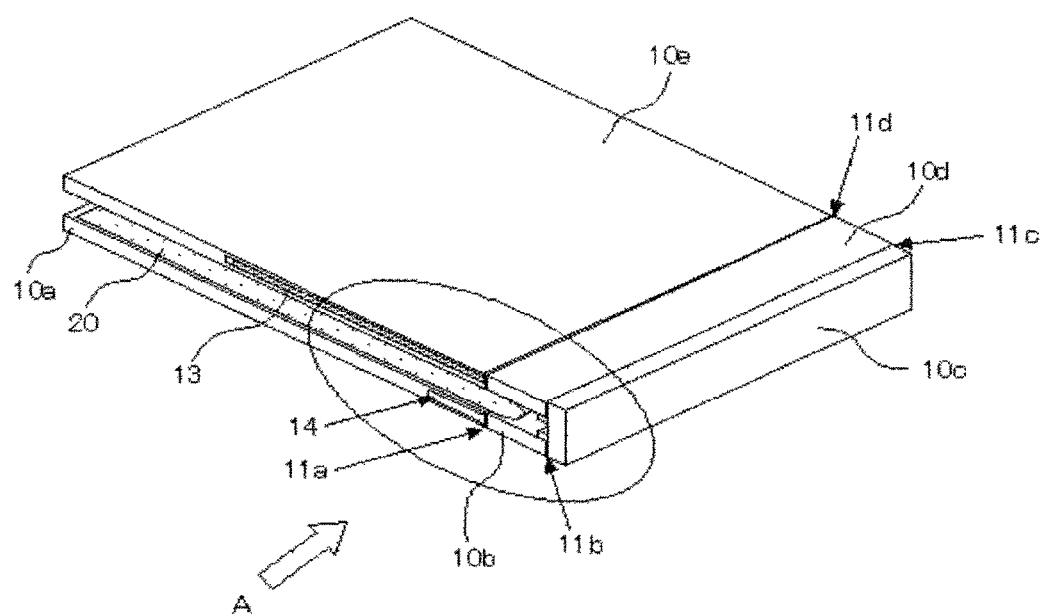
FIG. 13 is a perspective view illustrating an example (in the closed state) of an organic EL display apparatus according to one embodiment of the present invention.
Figure 14:
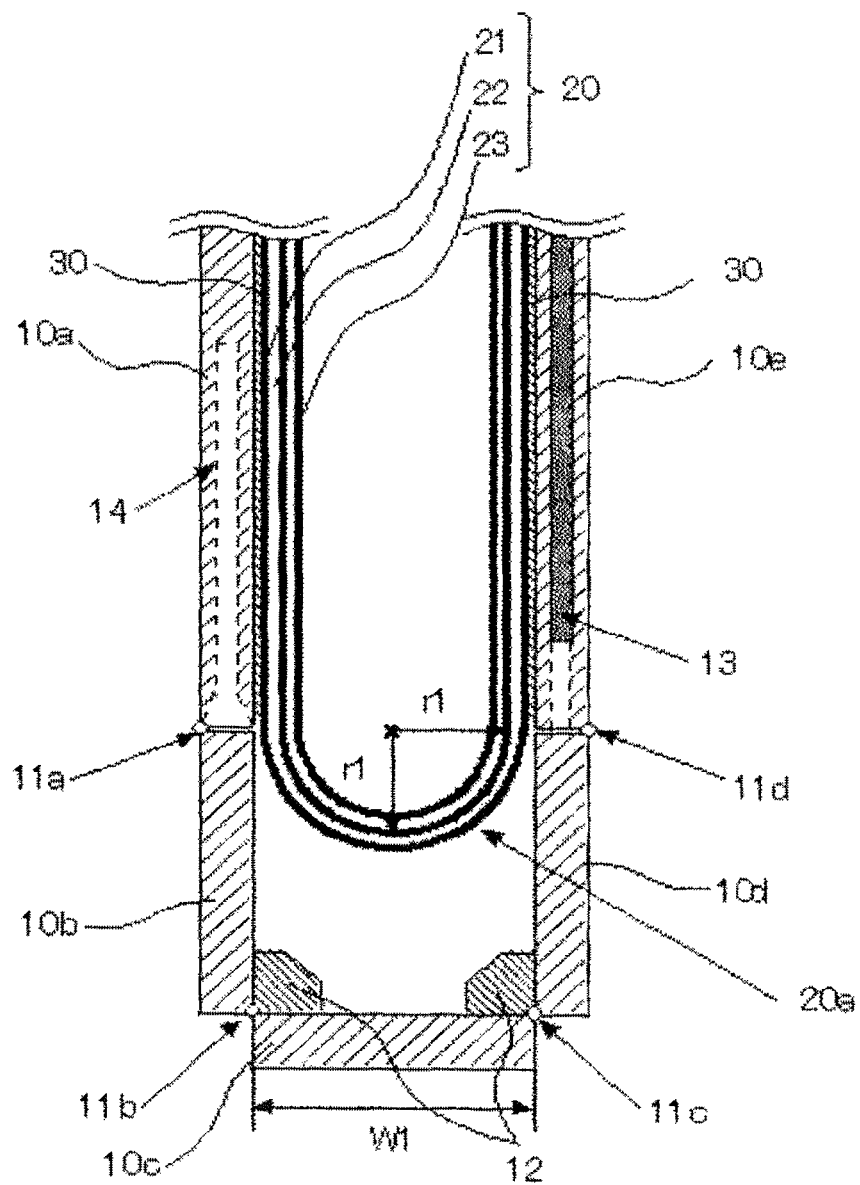
FIG. 14 is a cross-sectional view illustrating one example (in the closed state) of the organic EL display apparatus according to one embodiment of the present invention.

FIG. 13 is a perspective view illustrating the closed state of an organic EL display apparatus according to one embodiment of the present invention, and FIG. 14 is a side cross-sectional view illustrating a structure in the vicinity of the folding portion as seen from "A" side of FIG. 13.

As illustrated in FIG. 13, the organic EL display apparatus of the present embodiment comprises five plate-shaped housings 10a to 10e, and four foldable parts (hinge parts) 11a to 11d, and a flexible display section 20. The housings 10a and 10b are bendably connected to each other by the foldable part 11a, the housings 10b and 10c are bendably connected to each other by the foldable part 11b, the housings 10c and 10d are bendably connected to each other by the foldable part 11c, and the housings 10d and 10e are bendably connected to each other by the foldable part 11d. That is, the housings 10b to 10d correspond to the first housing (the housing 10c corresponds to a bottom part, and the housings 10b and 10d correspond to a side part), the housings 10a and 10e correspond to the second and third housings, and the housings 10a and 10e have a configuration that can be bent in a direction being separated from each other by the foldable part 11a and foldable part 11d.

As illustrated in FIG. 14, the flexible display section 20 has a configuration with flexibility in which a light emitting layer 22 is sandwiched by a flexible substrate 21 and a flexible substrate 23 and these components are integrally formed. The light emitting layer 22 includes a switching element such as a TFT, a light emitting element such as the organic EL element, and a touch sensor as necessary. The flexible substrate 21 is fixed to the housings 10a and 10e by an additive 30.

In addition, the housings 10b, 10c and 10d are configured to make a space not so as to be bent at a predetermined angle (90 degrees in FIG. 14) or less by a bending angle limiting member 12, and a folding portion 20a of the flexible display section 20 is housed in the space formed by these housings 10b, 10c and 10d, with being bent at a curvature of a predetermined value or more. Specifically, if a thickness of the flexible substrate 21 is t1, and a width of the housing 10c is W1, a minimum curvature radius r1 of the light emitting layer 22 of the flexible display section 20 is limited as represented by Equation 1 below.

$$r1 = \frac{(W1 - 2 \times t1)}{2} \tag{1}$$

Accordingly, by appropriately setting W1 and t1, a curvature radius r of 2 mm or more is secured, and thus the minimum curvature radius r1 is possible to prevent the light emitting element or TFT of the light emitting layer 22 from being destroyed.

A slide type holding member 13 is formed of a material having strength and a thickness capable of withstanding the pressing applied thereto during a touch operation of the flexible display section 20 and has a larger size than the folding portion 20a. The slide type holding member 13 is housed so as to be taken out in one of the housings 10a and 10e (herein, the housing 10e). While the other one (herein, the housing 10a) has a holding member sliding guide 14 (a space formed by hollowing out the housing 10a) into which the slide type holding member 13 can be inserted.

Figure 15:
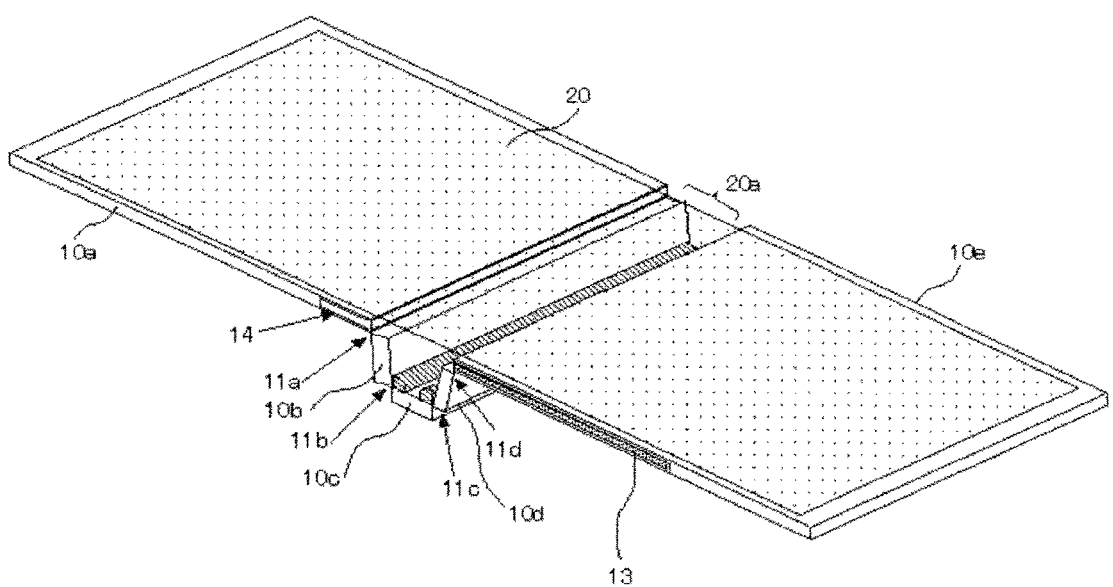
FIG. 15 is a perspective view illustrating one example (in the open state) of the organic EL display apparatus according to one embodiment of the present invention.
Figure 16:
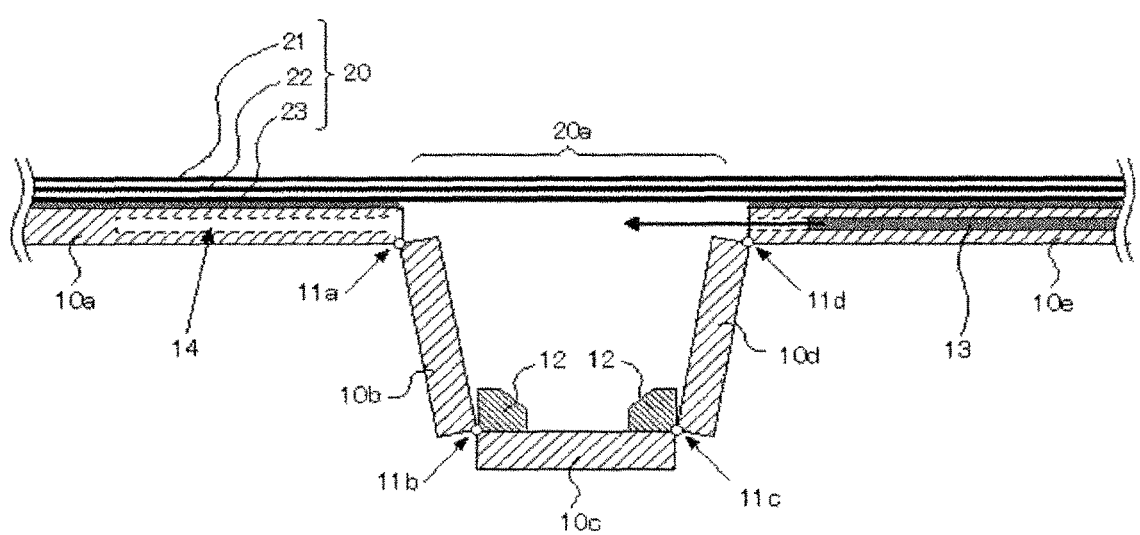
FIG. 16 is a cross-sectional view illustrating one example (in the open state) of the organic EL display apparatus according to one embodiment of the present invention.

FIGS. 15 and 16 illustrate an open state of the organic EL display apparatus having the above-described configuration. In order to make it easy to understand the structure of the organic EL display apparatus, the flexible display section is translucently illustrated in FIG. 15. As illustrated in FIGS. 15 and 16, by bending the housings 10a and 10e in the opposite direction around the foldable part 11a and foldable part 11d as a fulcrum, it is possible to flatly unfold the flexible display section 20. In this case, the housings 10b, 10c and 10d are a leg (handle) which protrudes from the flat surfaces of the housings 10a and 10e to the back side.

Herein, the flat state of the flexible display section 20 is difficult to be maintained by only bending the housings 10a and 10e in the opposite direction, because an angle between the housings 10a and 10e may be varied depending on bending angles of the foldable parts 11a, 11b, 11c and 11d. In addition, since a portion under the folding portion 20a of the flexible display section 20 is the space formed by the housings 10b, 10c and 10d, if a user touches the folding portion 20a, the folding portion 20a is deflected by the touch, such that a touch operation may be difficult, and damage the folding portion 20a. Therefore, in consideration of these conditions, the slide type holding member 13 housed in the housing 10e slides to the holding member sliding guide 14 of the housing 10a.

Figure 17:
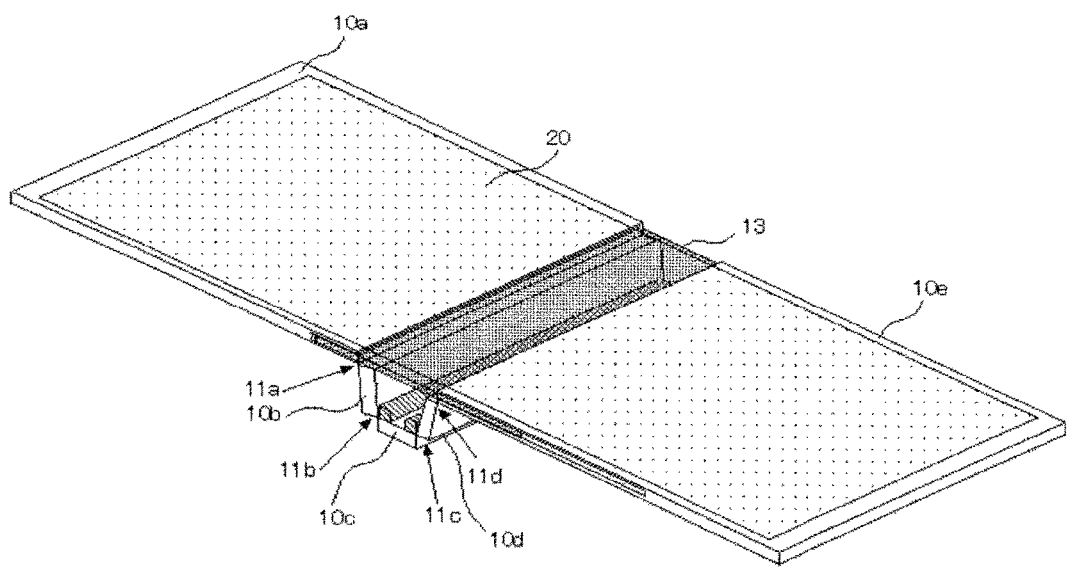
FIG. 17 is a perspective view illustrating one example (a state in which a slide type holding member is inserted) of the organic EL display apparatus according to one embodiment of the present invention.
Figure 18:
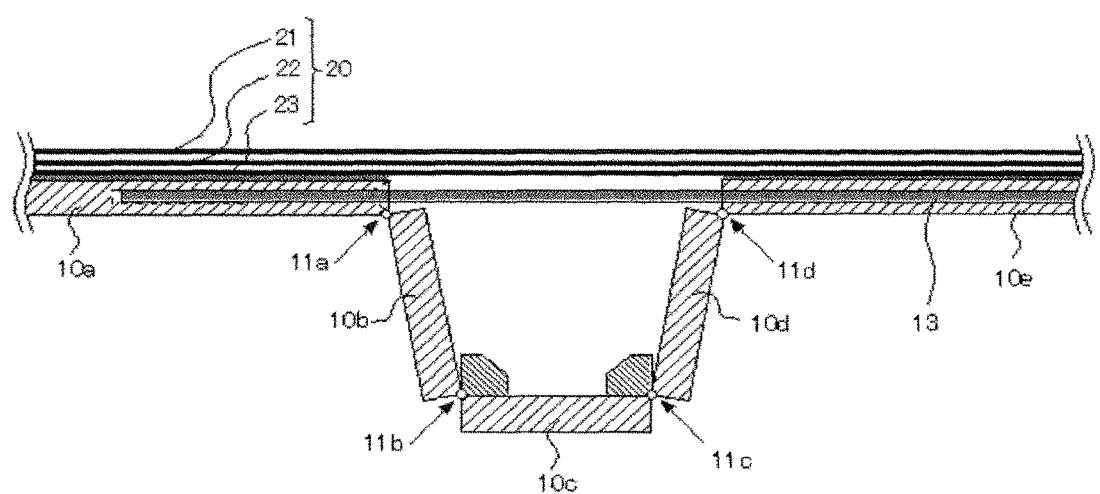
FIG. 18 is a cross-sectional view illustrating one example (the state in which the slide type holding member is inserted) of the organic EL display apparatus according to one embodiment of the present invention.

FIGS. 17 and 18 illustrates a state in which the slide type holding member 13 is inserted into the holding member sliding guide 14 of the housing 10a. In order to make it easy to understand the structure of the organic EL display apparatus, the flexible display section is translucently illustrated in FIG. 17. By inserting the slide type holding member 13 into the holding member sliding guide 14, the housings 10a and 10e may be fixed to each other, and the flexible display section 20 may be maintained in a flat state. Then, due to a state in which the slide type holding member 13 is present under the folding portion 20a of the flexible display section 20, it is possible to control a deflection of the flexible display section 20, and improve the touch operability of the folding portion 20a.

Further, in order to make it easy to slide the slide type holding member 13, protrusion parts such as knobs may be formed thereon. In addition, in FIG. 17, in order for the flexible display section 20 to function as a touch panel, the slide type holding member 13 is configured so as to support the entire lower portion of the folding portion 20a of the flexible display section 20, but, when only performing the display by the flexible display section 20 (not provided with the function as a touch panel), it may be configured so as to support a part of the lower portion of the folding portion 20a (to such an extent that the folding portion 20a is not deflected due to its own weight). In addition, a gap, as illustrated in FIG. 18, between the flexible display section 20 and the slide type holding member 13 may be reduced to a level with no practical problem by moving positions of the slide type holding member 13 and the holding member sliding guide 14 close to the flexible display section 20. Further, in the present embodiment, since an opening of the end face of the holding member sliding guide 14 of the housing 10a is expanded, even though the housings 10a and 10e are not in alignment with each other, the slide type holding member 13 may be easily inserted into the holding member sliding guide 14.

Figure 19:
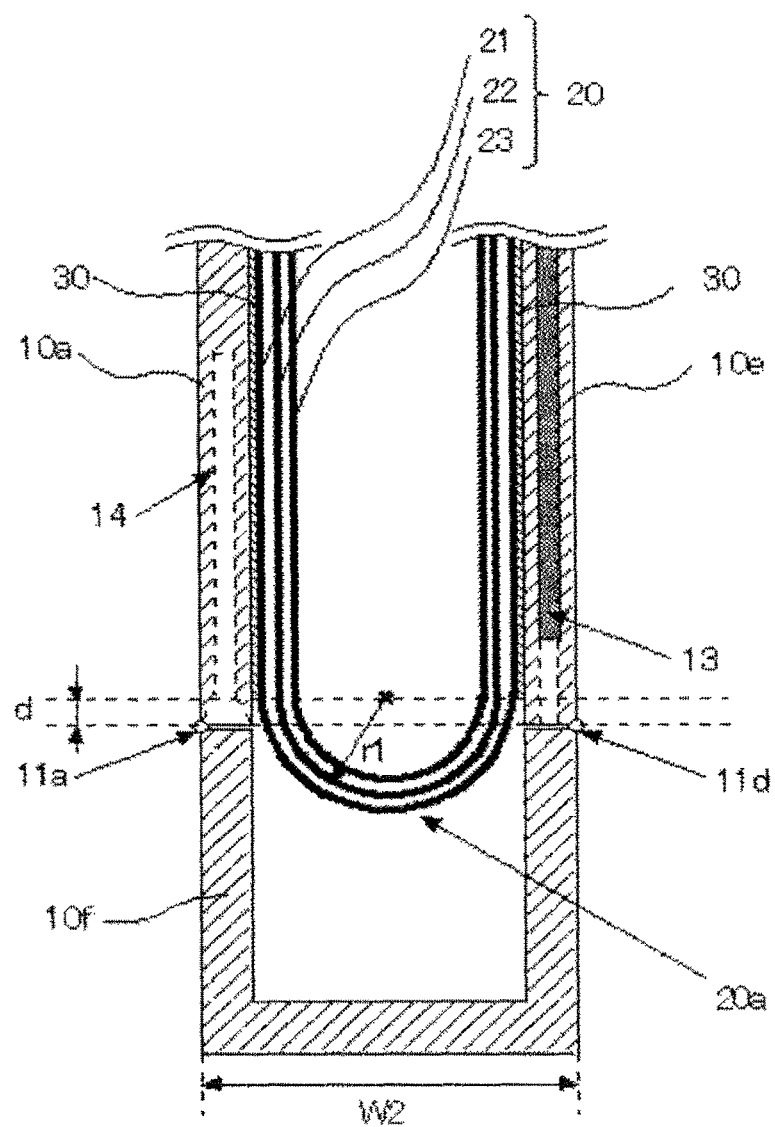
FIG. 19 is a cross-sectional view illustrating another example (in the closed state) of the organic EL display apparatus according to one embodiment of the present invention.

In FIGS. 13 to 18, the housings 10b, 10c and 10d have a structure that can be bent by the foldable parts 11b and 11c, but it is possible to make these housings into an integrated structure. For example, as illustrated in FIG. 19, instead of the housings 10b, 10c and 10d, an integrated channel-shaped housing 10f is disposed, and the flexible display section 20 is fixed so that a central position of the folding portion 20a of the flexible display section 20 moves in a direction (upside of the FIG. 19) separated from the channel-shaped housing 10f. In this case, if a width of the channel-shaped housing 10f is W2, and a distance connecting the central position of the folding portion 20a with the foldable part 11a and the foldable part 11d is d, a curvature radius r1 of the light emitting layer 22, and the W2 and d are set so that the curvature radius r1 of the light emitting layer 22 satisfies Equations 2 and 3 below.

$$r1 \times \pi = (W2 + 2 \times d) \quad (2)$$

$$r1 \geq 2 \text{ mm} \quad (3)$$

Figure 20:
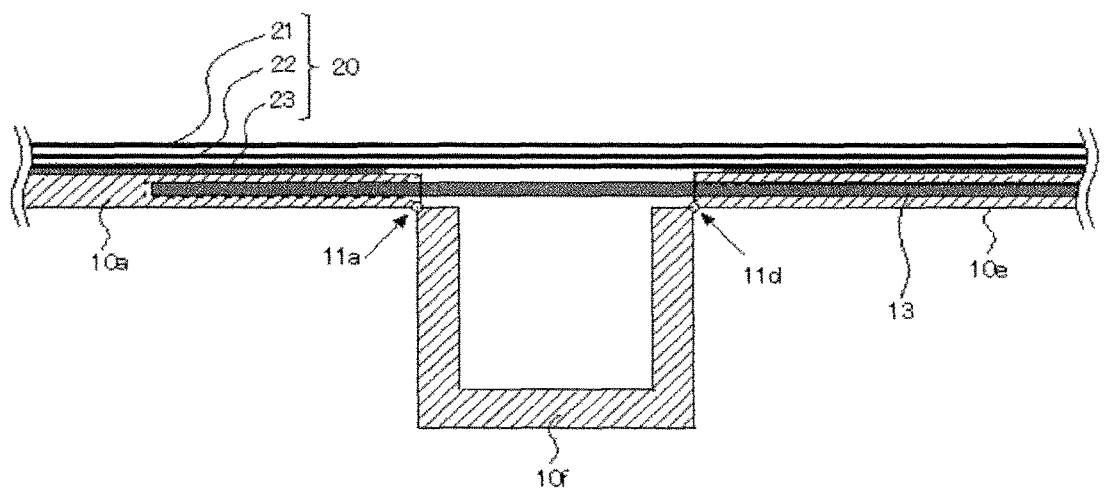
FIG. 20 is a cross-sectional view illustrating another example (in the open state) of the organic EL display apparatus according to one embodiment of the present invention.

Thereby, it is possible to prevent the light emitting element of the light emitting layer 22 or TFT from being destroyed, while, as illustrated in FIG. 20, it is possible to make the flexible display section 20 in a flat state while the housings 10a and 10e are in alignment with each other.

Further, in FIGS. 19 and 20, the cross section of the space of the channel-shaped housing 10f is formed in an open square shape, but the bottom of the channel-shaped housing 10f may be formed in a curved shape, such as a U shape. In addition, the channel-shaped housing 10f may be formed in a shape such that an opening part thereof is slightly narrowed so that open ends (upper end parts in FIG. 19) of the housing 10a and the housing 10e come into close contact with each other.

Figure 21:
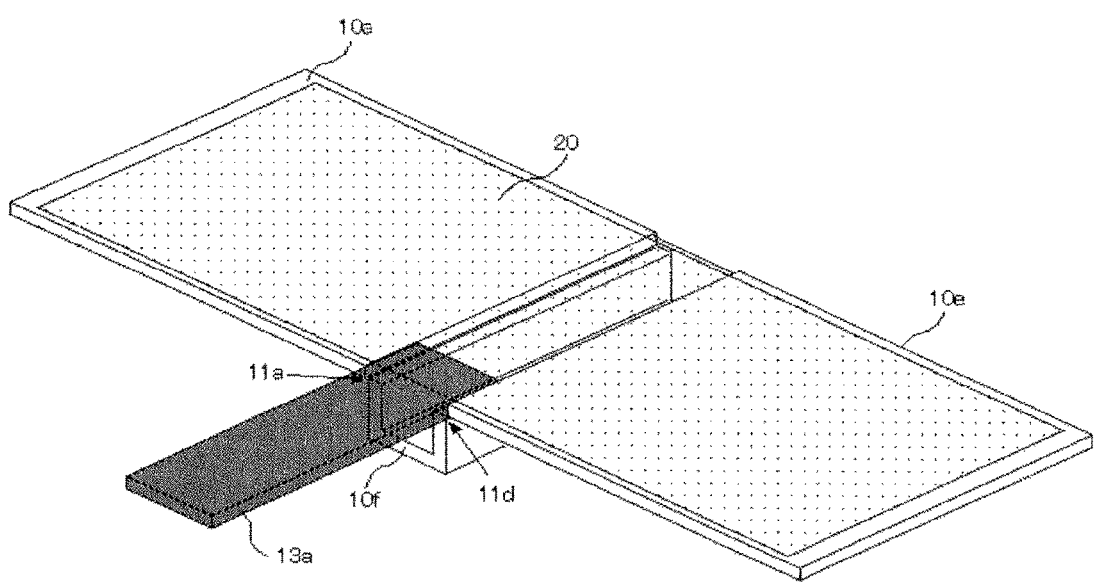
FIG. 21 is a perspective view illustrating another example (in the open state) of the organic EL display apparatus according to one embodiment of the present invention.

In addition, in FIGS. 13 to 20, by inserting the slide type holding member 13 housed in the housing 10e into the holding member sliding guide 14 of housing 10a, the housings 10a and 10e are fixed to each other, and the touch operability of the folding portion 20a of the flexible display section 20 is improved, but it is not always necessary to house the holding member in the housing. FIG. 21 illustrates another example of the structure of the organic EL display apparatus according to the present embodiment, and in order to make it easy to understand the structure of the organic EL display apparatus, the flexible display section and the holding member are translucently illustrated in FIG. 21.

Figure 22:
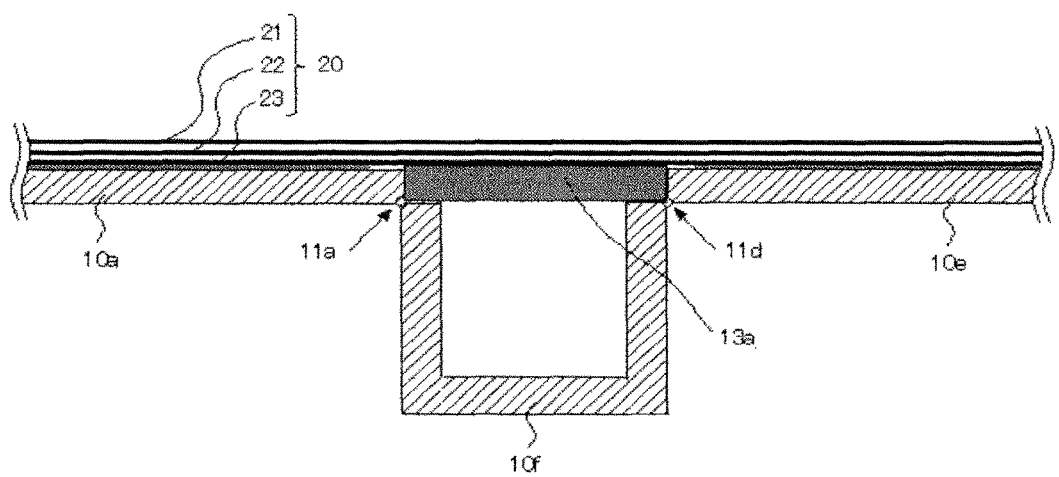
FIG. 22 is a cross-sectional view illustrating another example (in the open state) of the organic EL display apparatus according to one embodiment of the present invention.

As illustrated in FIG. 21, a plug-in holding member 13a may be inserted into a space formed between the housings 10a and 10e, and the flexible display section 20. Also in the above-described structure, as illustrated in FIG. 22, the housings 10a and 10e may be fixed to each other. In addition, since the plug-in holding member 13a is disposed over the entire lower portion of the folding portion 20a of the flexible display section 20, it is possible to improve the touch operability of the folding portion 20a. Further, in FIGS. 21 and 22, the plug-in holding member 13a is used not only for the structure including the integrated channel-shaped housing 10f, but also for the structures illustrated in FIGS. 13 to 18.

Figure 23:
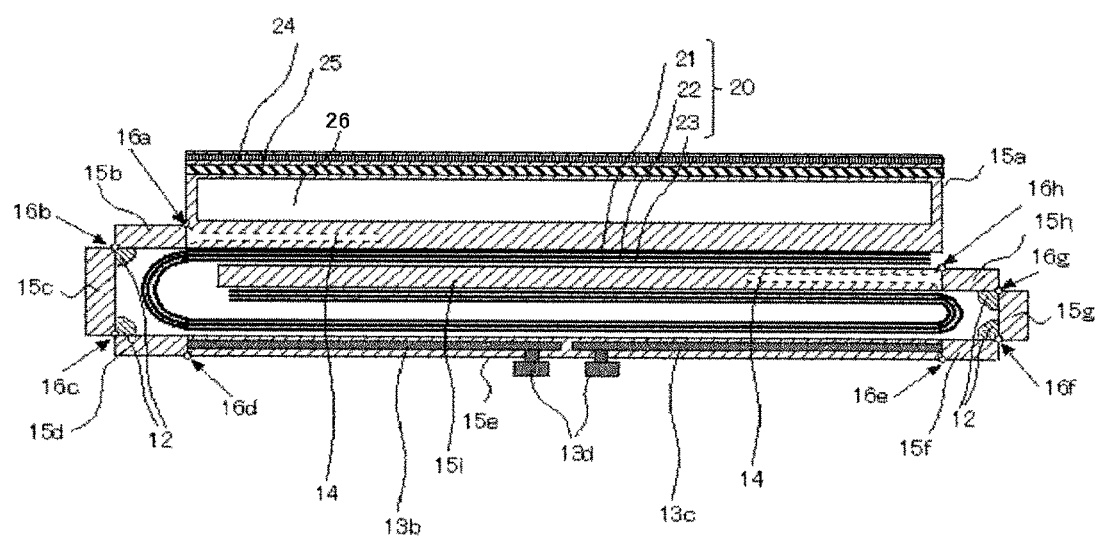
FIG. 23 is a cross-sectional view illustrating one example (in a folded state into three folding) of electric equipment according to one embodiment of the present invention.

In the above, the case of two-folding the flexible display section 20 is described with reference to FIGS. 13 to 22. Such a structure of the present embodiment may be applied to the case of multi-folding the flexible display section 20 into three or more. FIG. 23 illustrates an example of electric equipment (electric equipment referred to as a smart tablet, tablet phone, and the like which are together provided with the functions of a smartphone and a tablet) comprising the organic EL display apparatus.

As illustrated in FIG. 23, housings 15b to 15i are bendably connected to a housing 15a, which includes a display control system 26 (control unit for realizing the functions of the smartphone and the tablet) therein, and has a reflective liquid crystal display apparatus 25 and a touch screen 24 formed on one surface thereof, through foldable parts 16a to 16h. That is, the housings 15b to 15d, and housings 15f to 15h correspond to the first housing, the housing 15e corresponds to the second housing, and the housings 15a and 15i correspond to the third housing. In addition, the flexible display section 20 in which the light emitting layer 22 is sandwiched between the flexible substrate 21 and the flexible substrate 23 is disposed in a region reaching the housing 15i from the other surface of the housing 15a, and the flexible display section 20 is fixed to the housings 15a, 15e and 15i by the adhesive.

Further, slide type holding members 13b and 13c are housed in the housing 15e, and as necessary, protrusion parts such as knobs 13d are formed thereon, while a holding member sliding guide 14 into which the slide type holding member 13b can be inserted is formed in the housing 15a, and a holding member sliding guide 14 into which the slide type holding member 13c can be inserted is formed in the housing 15i. In addition, in order to secure a first space surrounded by the housings 15b, 15c and 15d, and a second space surrounded by the housings 15f, 15g and 15h, bending angle limiting members 12 are disposed therein.

Then, the housing 15a and the housing 15e are opened around the foldable parts 16a and 16d as a fulcrum, and further, the housings 15e and 15i are opened around the foldable parts 16e and 16h as a fulcrum. Thereafter, as illustrated in FIG. 24, if the slide type holding member 13b housed in the housing 15e is inserted into the holding member sliding guide 14 of the housing 15a by sliding the same, and the slide type holding member 13c housed in housing 15e is inserted into the holding member sliding guide 14 of the housing 15i by sliding the same, the housings 15a to 15i are in the open state in a flat shape.

By employing the three-folding structure as described above, it is possible to house a screen having a tablet size while maintaining the same external dimensions as the smartphone. When using only the function of the smartphone, by using the reflective liquid crystal display apparatus 25 in the closed state, it is possible to reduce power consumption. In addition, when using as the tablet, it is possible to read various information using the flexible display section 20 having a large area, and improve the touch operability of the folding portion by the slide type holding members 13b and 13c. Further, since convex parts formed by the housings 15b, 15c and 15d, and the housings 15f, 15g and the housing 15h function as a leg (handle), handling properties may be improved.

Figure 24:
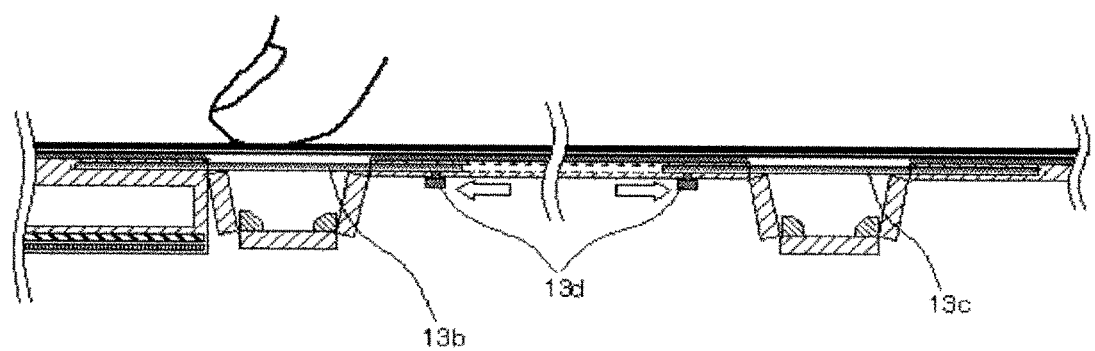
FIG. 24 is a cross-sectional view illustrating one example (in the open state in which the slide type holding members are inserted) of the electric equipment according to one embodiment of the present invention.

Further, FIGS. 23 and 24 illustrate the structure in which the housing provided with the reflective liquid crystal display apparatus is disposed at an end thereof, but it may be formed as a structure in which a plurality of housings are bendably connected to both sides of the housing provided with the reflective liquid crystal display apparatus, and one housing is folded, then the other housing is folded so as to be overlapped thereon. In addition, in FIGS. 23 and 24, the slide type holding member 13b and the slide type holding member 13c are housed in the housing 15e, and the holding member sliding guide 14 is provided in the housings 15a and 15i, but the slide type holding members 13 may be housed in the respective housings 15a and 15i, and two holding member sliding guides 14 may be provided in the housing 15e. Further, the electric equipment applying the structures illustrated in FIGS. 13 to 18 is illustrated and described in FIGS. 23 and 24, but the structure including the housing illustrated in FIGS. 19 and 20, and the structure of inserting the plug-in holding member illustrated in FIGS. 21 and 22 may also be applied. Hereinafter, the structure of the flexible display section (organic EL display apparatus), an operation and a manufacturing method will be described using Embodiments 1 and 2.

[Embodiment 1]

First, the structure and operation of the organic EL display apparatus will be described with reference to FIGS. 25 to 31.

Figure 25:
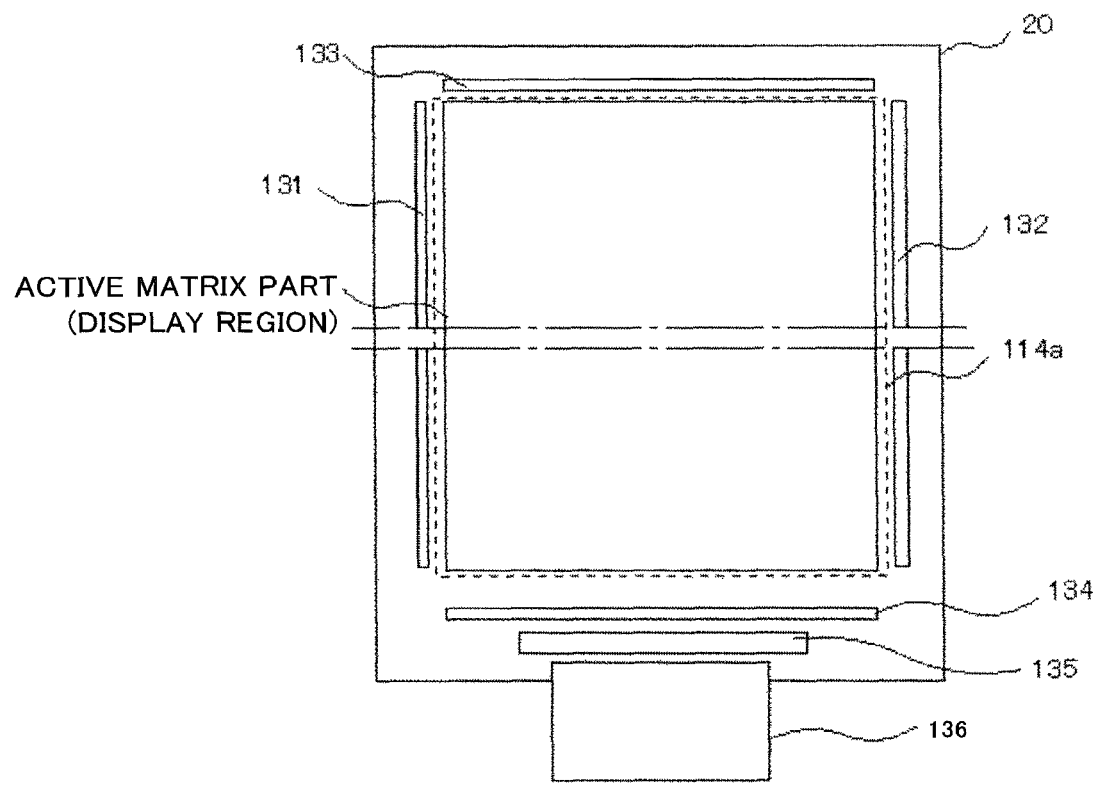
FIG. 25 is a plan view of an organic EL display apparatus according to a first embodiment of the present invention.

FIG. 25 illustrates the organic EL display apparatus as an example of the electro-optical device of the present invention. The organic EL display apparatus comprises the flexible display section 20. As described above, the flexible display section 20 includes the light emitting layer 22 which has the switching element such as a TFT, the light emitting element, the touch sensor, and the like, and the flexible substrates 21 and 23 which sandwich the light emitting layer 22. In addition, a scanning driver 131 for driving a scanning line connected to the TFT of the light emitting layer 22, an emission control driver 132 for controlling a light emitting period of each pixel, a data line electro-static-discharge (ESD) protection circuit 133 for preventing damage due to electro-static-discharge, a demultiplexer (1:n DeMUX) 134 for restoring a data stream with a high transfer rate to a plurality of data streams with an original low transfer rate, a driver IC 135 which is mounted using an anisotropic conductive film (ACF) to drive data lines, and the like, are disposed around a cathode electrode formation region 114a (dashed line in FIG. 25) formed outside of the display region of the organic EL display apparatus by a mask deposition, and connected to an external device through a flexible printed circuit (FPC) 136. Further, FIG. 25 illustrates an example of the organic EL display apparatus of the present embodiment, however, the shape and configuration thereof may be appropriately changed. For example, since the organic EL display apparatus of the present embodiment is a folding type, the scanning driver 131 and the emission control driver 132 are formed by separating into two so as not to overlap with each other on the folding portion (one-dot chain line in FIG. 25), but it is not always necessary to separate if the function thereof is not deteriorated by bending and stretching.

Figure 26:
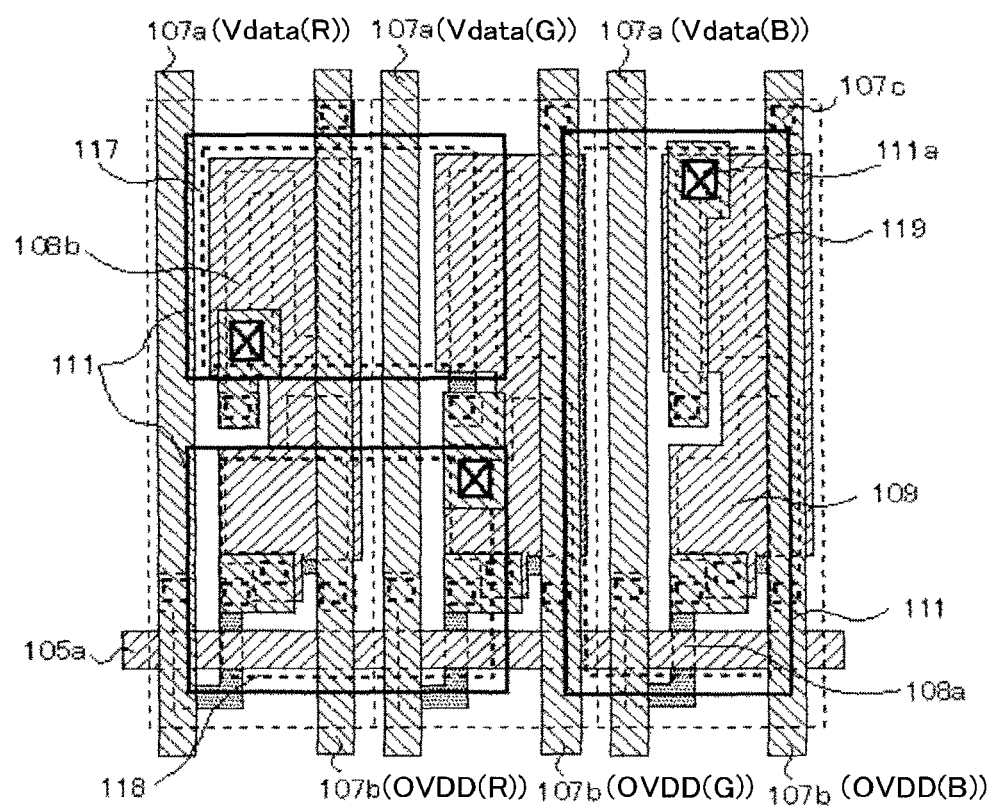
FIG. 26 is a plan view schematically illustrating a configuration of a pixel (corresponding to three sub-pixels) of the organic EL display apparatus according to the first embodiment of the present invention.
Figure 27:
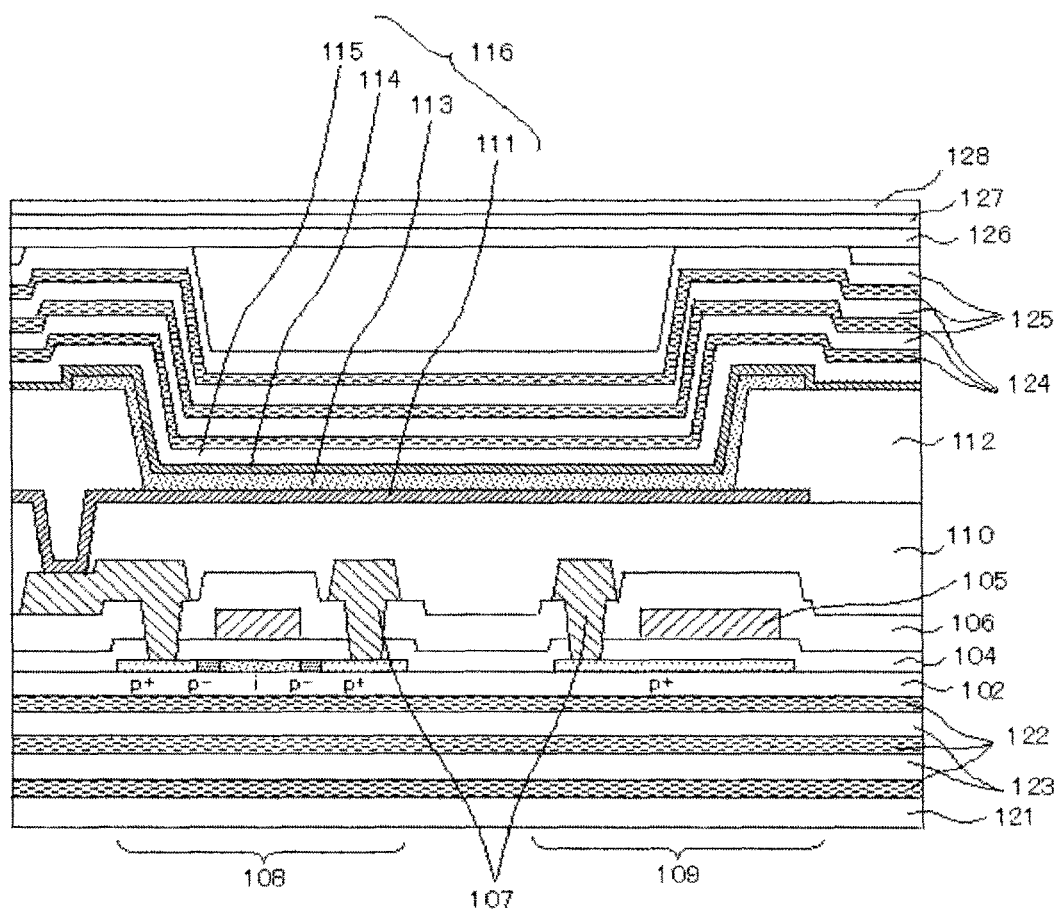
FIG. 27 is a cross-sectional view schematically illustrating a configuration of a pixel (corresponding to one sub-pixel) of the organic EL display apparatus according to the first embodiment of the present invention.
Figure 28:
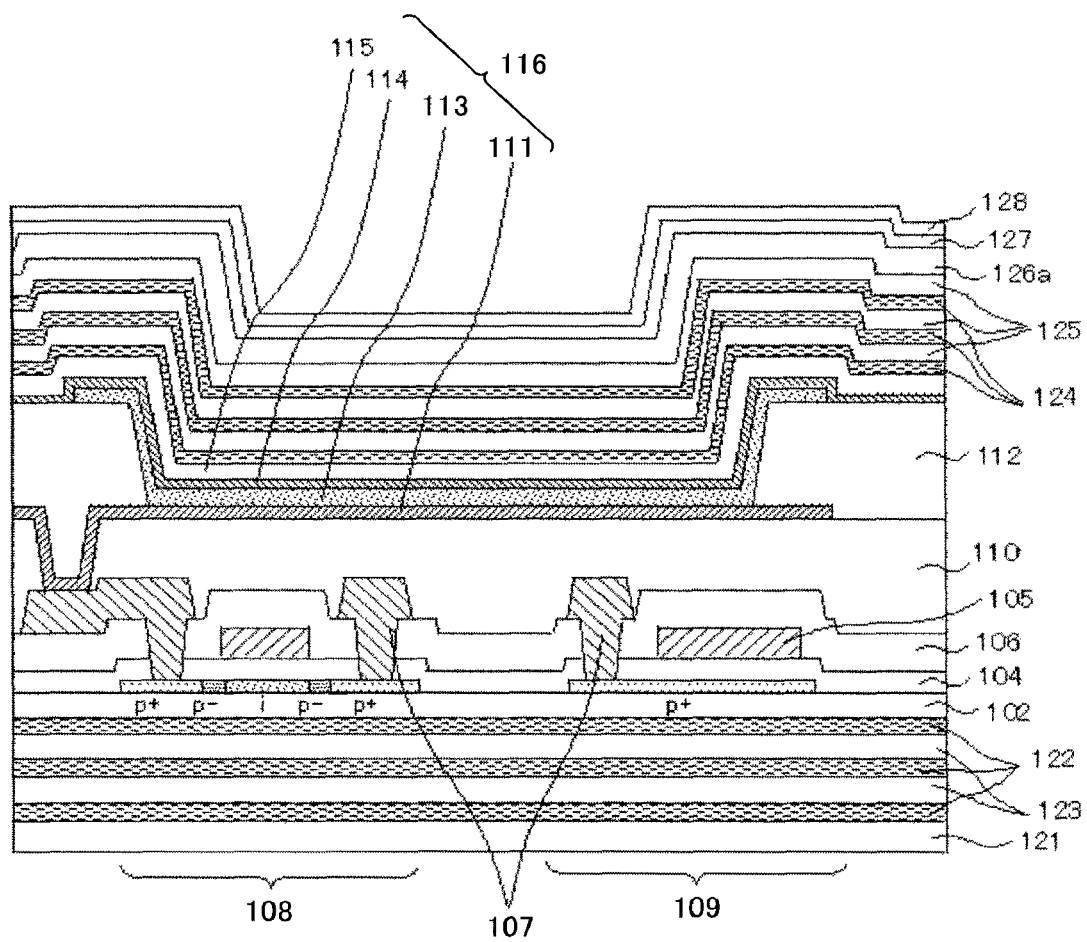
FIG. 28 is a cross-sectional view schematically illustrating another configuration of the pixel (corresponding to one sub-pixel) of the organic EL display apparatus according to the first embodiment of the present invention.

FIG. 26 is a plan view paying attention to one pixel (three sub-pixels) of the light emitting element formed on the light emitting layer 22, wherein the pixel is repeatedly formed in an extending direction of the data lines and an extending direction of the scanning line (gate electrode). In addition, FIGS. 27 and 28 are sectional views paying attention to one sub-pixel, and in order to make it easy to understand the structure of the sub-pixel, describe the sub-pixel in a simplified manner by excluding the regions of an M2 driving TFT 108b (TFT part 108) and a holding capacitor part 109 from the plan view of FIG. 26. Further, as an arrangement structure of the sub-pixel, there are a vertical stripe type in which the sub-pixels of RGB are aligned, the Pentile type in which the sub-pixels are formed of two colors of the G and B, or two colors of the G and R, an S stripe type in which the R and G are arranged in the same column, and the B is disposed in the next column of R and G and in the row of R and G and the like. The organic EL display apparatus of the present invention may be applied to any type arrangement structure, but hereinafter, the present embodiment will be described with respect to the S stripe type arrangement structure.

The flexible display section 20 includes a flexible substrate 121, a laminate of an inorganic thin film 122 and an organic film 123 (which are collectively referred to as the flexible substrate 21 in FIGS. 13 to 24), polysilicon layers 103 (an i layer 103a, a p− layer 103b, and a p+ layer 103c) which are made of low-temperature polysilicon (LTPS), etc. formed thereon through an underlying insulation film 102, first metal layers 105 (a gate electrode 105a and a holding capacitor electrode 105b) formed through a gate insulation film 104, second metal layers 107 (data lines 107a, power supply lines 107b, source/drain electrodes, a first contact part 107c) which are connected to the polysilicon layer 103 through openings formed in an interlayer insulation film 106, a light emitting element 116 (an anode electrode 111, an organic EL layer 113, a cathode electrode 114 and a cap layer 115) formed through a flattened film 110, a laminate of an inorganic thin film 124 and an organic film 125, a film-type touch screen 126 (a touch screen 126a in FIG. 28), a λ/4 retardation plate 127 and a polarizing plate 128 (in FIGS. 13 to 24, the laminate of the inorganic thin film 124 and the organic film 125, the film-type touch screen 126 or the touch screen 126a, the λ/4 retardation plate 127, the polarizing plate 128, and the like are referred to as the flexible substrate 23 as a whole). Briefly, the flexible display section 20 is an organic EL display in which at least the switching element (TFT) and the light emitting element 116 (organic EL element) are formed in a matrix shape between the upper and lower flexible substrates.

In FIG. 27, an air layer is present between the upper organic film 125 which is the uppermost layer of the light emitting element 116 and the film-type touch screen 126. In this structure, the uppermost organic film 125 has a function as a light extraction layer, and since it has an optimized refractive index so as to efficiently extract light with respect to the air layer, there is a need to prevent the air layer from being collapsed even when the display is folded. Therefore, sufficient height and strength are required for an element separation film 112, and there is a need to select applying conditions and a thickness of the organic film 125 so as to prevent a space of the air layer from being filled.

Meanwhile, in FIG. 28, it is necessary for the organic film 125 of the uppermost layer and the touch screen 126a to completely close contact with each other so as not to form an air layer. If air partially comes into therebetween, optical characteristics of that portion may be largely different, thereby forming a patchy pattern. Therefore, it is necessary to apply the organic film 125 in a thickness enough to fill a step of the element separation film 112. The step is illustrated so as not to be filled in FIG. 28, but actually, the organic film 125 is flattened toward the upper layer, so that the surface of the uppermost layer is substantially flat. By this, it is easy to form a touch screen pattern thereon, and it is possible to prevent an air layer from forming even when compressing the touch screen film.

In FIG. 26, one pixel includes three regions sandwiched between the data lines 107a and the power supply lines 107b facing each other, and an M1 switch TFT 108a (TFT part), an M2 driving TFT 108b (TFT part), and the holding capacitor part 109 are disposed in each region. Herein, in the case of the RGB vertical stripe type pixel arrangement structure, the anode electrode 111 is formed by dividing into the above-described three regions, and is configured to drive the light emitting elements 116 formed in these regions by using the M1 switch TFT 108a, the M2 driving TFT 108b and the holding capacitor part 109 of each region. However, when realizing the S stripe type arrangement structure by the structure similar to the RGB vertical stripe type, the anode electrodes 111 for the sub-pixels of R and the sub-pixel of G are formed so as to bridge the two regions.

Specifically, with regard to the sub-pixel of B which is a color having the lowest luminosity factor, since the anode electrode 111 (a thick solid line on a right side of FIG. 26) is mainly formed in a longitudinally long shape along the data line 107a of B and the power supply line 107b of B, the light emitting element 116 emits light in a B light emitting region 119 on the right side of FIG. 26 (a thick dashed line on the right side of FIG. 26). Meanwhile, with regard to the sub-pixel of R, since the anode electrode 111 (a thick solid line on a upper left side of FIG. 26) is formed in a rectangular shape in the upper half of the region ranging from the data line 107a of R to the power supply line 107b of G, the light emitting element 116 emits light in an R light emitting region 117 on the upper left of FIG. 26 (a thick dashed line on the upper left of FIG. 26). In addition, with regard to the sub-pixel of G which is a color having the highest luminosity factor, since the anode electrode 111 (a thick solid line on a lower left side of FIG. 26) is formed in a rectangular shape in the lower half of the region ranging from the data line 107a of R to the power supply line 107b of G, the light emitting element 116 emits light in a G light emitting region 118 on the lower left of FIG. 26 (a thick dashed line on the lower left side of FIG. 26). Further, the color having the lowest luminosity factor and the color having the highest luminosity factor in the present disclosure and the claims are a relative sense, and refer to "the highest" and/or "the lowest" when compared between a plurality of sub-pixels included in one pixel.

That is, the sub-pixels of each color are driven by using the M1 switch TFT 108a, the M2 driving TFT 108b and the holding capacitor part 109 which are formed in a region surrounded by the data lines 107a and the power supply lines 107b of the corresponding color, but the anode electrode 111 for the sub-pixels of R and G are formed by dividing into up and down so as to bridge a region surrounded by the data line 107a and the power supply line 107b of R, and a region surrounded by the data line 107a and the power supply line 107b of G. Therefore, the second contact part 111a which connects the anode electrode 111 with the source/drain electrodes of the M2 driving TFT 108b is disposed as illustrated in FIG. 26. In addition, in order to control a crosstalk from the data line 107a, the M1 switch TFT 108a has a dual gate structure as illustrated in FIG. 26, and the M2 driving TFT 108b for converting a voltage to a current is formed in a routing shape as illustrated in FIG. 26 to minimize variations in the manufacturing process, thereby securing a sufficient channel length. Further, by extending the gate electrode of the driving TFT and using as an electrode of the holding capacitor part 109, it is possible to secure a sufficient holding capacitance in a limited area. By forming the above-described pixel structure, it is possible to increase the light emitting region for the respective colors of RGB, and reduce the current density per a unit area of each color to obtain a necessary luminance, and thereby enabling the long life of the light emitting element.

Further, a top-emission structure is illustrated in FIGS. 27 and 28, but a bottom-emission structure may also be employed.

Figure 29:
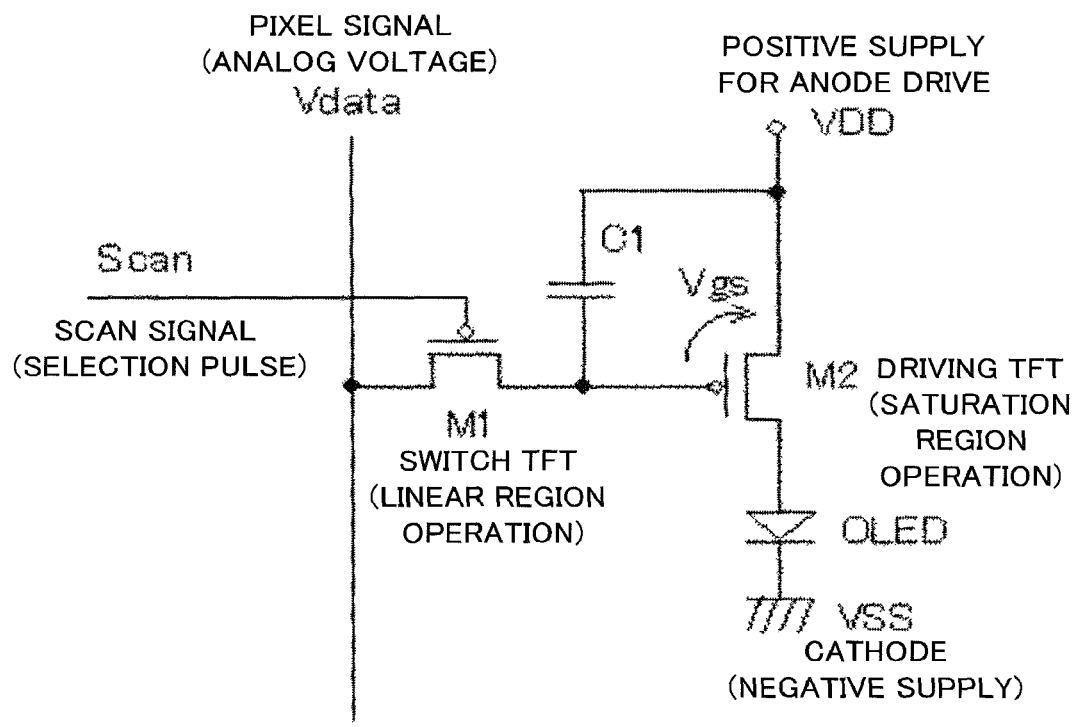
FIG. 29 is a view illustrating a configuration of a main circuit of a pixel of the organic EL display apparatus according to the first embodiment of the present invention.
Figure 30:
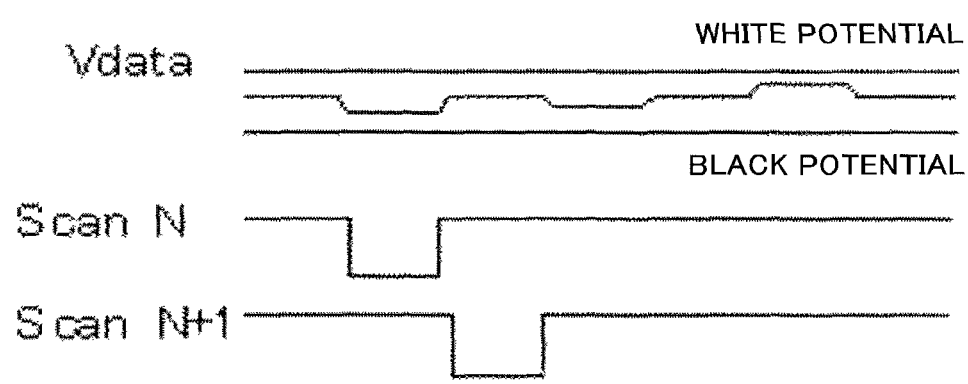
FIG. 30 is a waveform diagram of the pixel of the organic EL display apparatus according to the first embodiment of the present invention.
Figure 31:
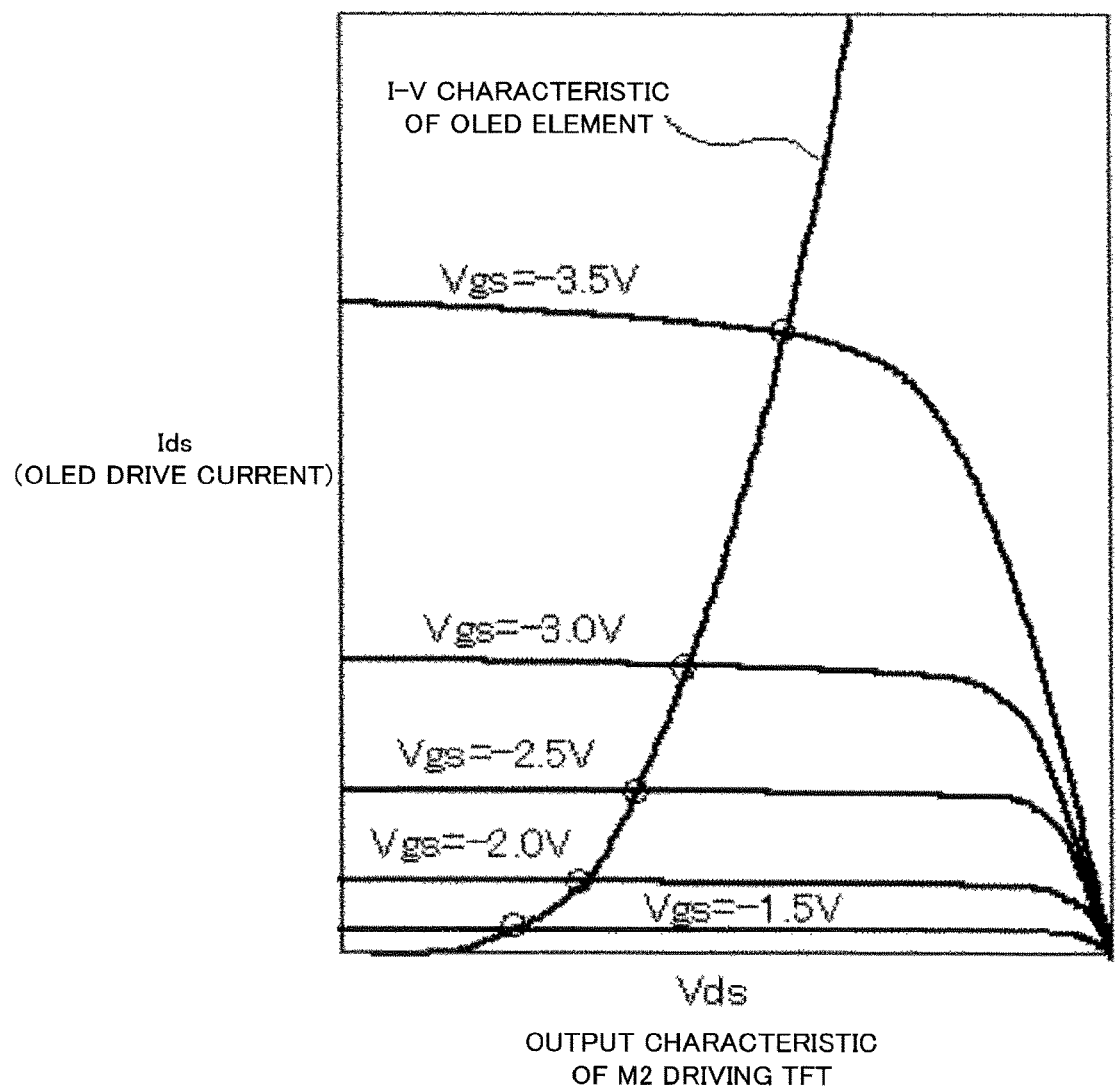
FIG. 31 is a diagram illustrating output characteristics of a driving TFT of the organic EL display apparatus according to the first embodiment of the present invention.

Next, a method of driving each sub-pixel will be described with reference to FIGS. 29 to 31. FIG. 29 is a view illustrating a main circuit of the sub-pixel, FIG. 30 is a waveform diagram of the sub-pixel, and FIG. 31 is a diagram for output characteristics of the driving TFT. Each sub-pixel includes an M1 switch TFT, an M2 driving TFT, a C1 holding capacitor, and a light emitting device (OLED), and is driven and controlled by a two-transistor method. The M1 switch TFT is a p channel field effect transistor (FET), and a gate terminal thereof is connected to the scanning line (Scan), and a drain terminal thereof is connected with the data line (Vdata). The M2 driving TFT is a p channel FET, and a gate terminal thereof is connected to the source terminal of the M1 switch TFT. In addition, the source terminal of the M2 driving TFT is connected to a power supply line (VDD), and then the drain terminal thereof is connected to the light emitting device (OLED). In addition, the C1 holding capacitor is formed between the gate/sources of the M2 driving TFT.

In the above configuration, a selection pulse is output to the scanning line (Scan), and when the M1 switch TFT is in an open state, the data signal supplied through the data line (Vdata) is written in the C1 holding capacitor as a voltage value. The holding voltage written in the C1 holding capacitor is held through one frame period, and by the holding voltage, the conductance of the M2 driving TFT is changed in an analog manner, and a forward bias current corresponding to the light emitting gradation is supplied to the light emitting device (OLED).

As described above, by driving the light emitting element (OLED) with a constant current, even when the resistance is changed due to a deterioration of the light emitting device (OLED), it is possible to constantly maintain light emission luminance, and thereby it is suitable as the method of driving the organic EL display apparatus of the present invention.

[Embodiment 2]

Next, a method for manufacturing the organic EL display apparatus (flexible display section) will be described with reference to FIGS. 32 to 39. Herein, FIGS. 32 to 39 illustrate the method for manufacturing the organic EL display apparatus having the structure illustrated in FIG. 27. In addition, FIGS. 33, 35, 37 and 39 are cross-sectional views of the TFT part, the holding capacitor part and the light emitting element paying attention to one sub-pixel.

Figure 32:
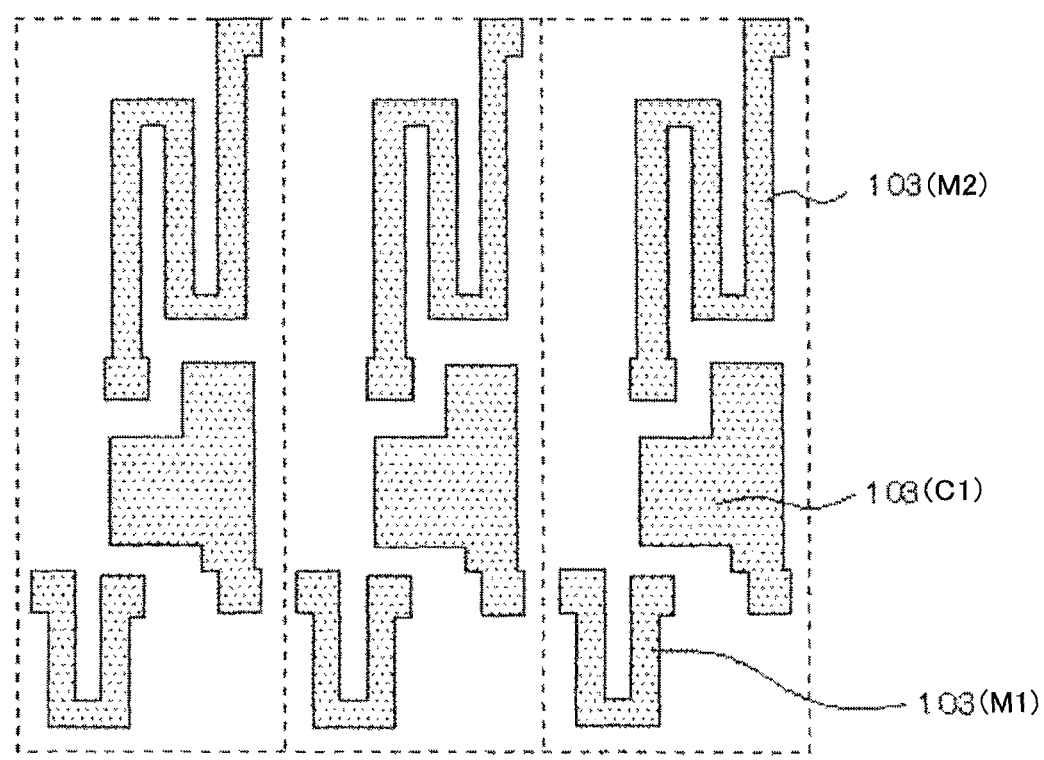
FIG. 32 is a plan view describing a manufacturing process (first process) of the organic EL display apparatus according to a second embodiment of the present invention.
Figure 33:
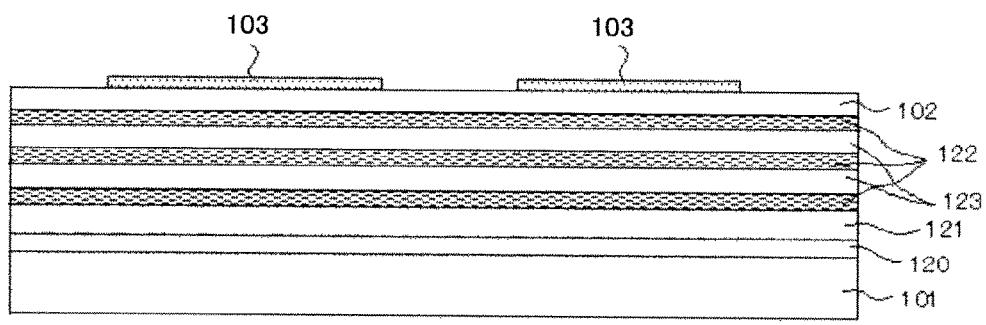
FIG. 33 is a cross-sectional view describing the manufacturing process (first process) of the organic EL display apparatus according to the second embodiment of the present invention.

First, as illustrated in FIGS. 32 and 33, a peeling film 120 of an organic resin, etc. which can be peeled-off by peeling liquid is formed on a glass substrate 101, and a flexible substrate 121 having flexibility is formed of polyimide, etc. thereon. Then, an inorganic thin film 122 such as a silicon oxide film or a silicon nitride film and an organic film 123 such as an organic resin are alternately laminated thereon, etc.

Then, for example, a silicon nitride film, etc. is deposited on the uppermost film (herein, the inorganic thin film 122) by a chemical vapor deposition (CVD) method, etc. to form the underlying insulation film 102. Next, the TFT part and the holding capacitor part are formed using a known low-temperature polysilicon TFT fabrication technique. Specifically, amorphous silicon is deposited by the CVD method, etc., and is crystallized by excimer laser annealing (ELA) to form a polysilicon layer 103. In this regard, in order to control the variations in an output current by sufficiently securing the channel length of the M2 driving TFT used as a voltage-current conversion amplifier, and enable connection of the source of the M1 switch TFT with the data line 107a, connection of the drain of the M1 switch TFT with the C1 holding capacitor, connection of the C1 holding capacitor with the power supply line 107b, connection of the source of the M2 driving TFT with the power supply line 107b, and connection of the drain of the M2 driving TFT with the anode electrode 111 of each sub-pixel, the polysilicon layers 103 are routed as illustrated in FIG. 32.

Figure 34:
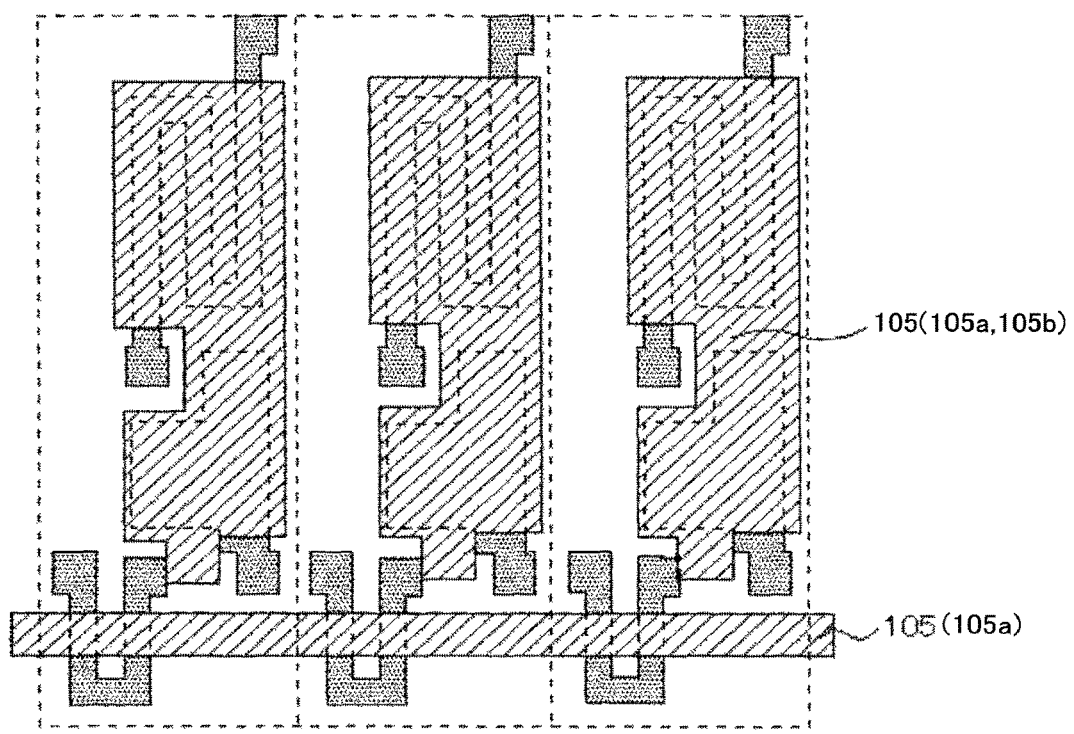
FIG. 34 is a plan view describing the manufacturing process (second process) of the organic EL display apparatus according to the second embodiment of the present invention.
Figure 35:
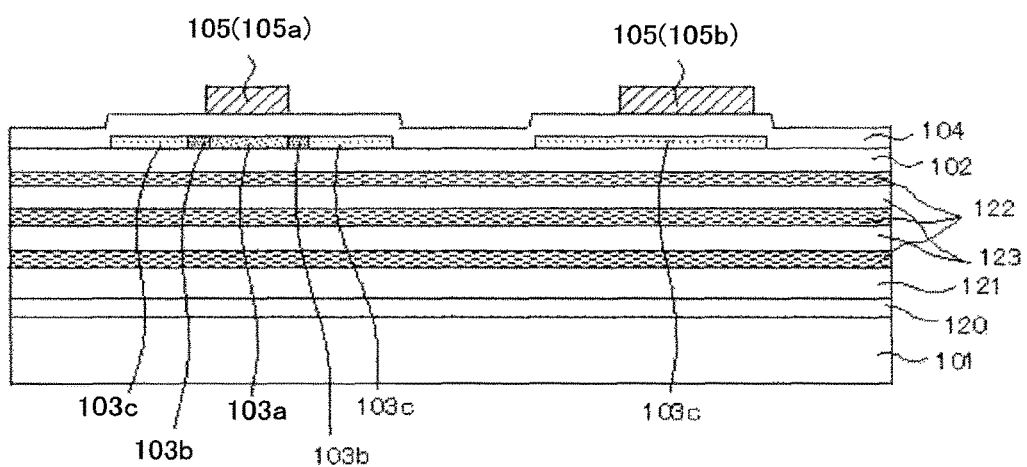
FIG. 35 is a cross-sectional view describing the manufacturing process (second process) of the organic EL display apparatus according to the second embodiment of the present invention.

Next, as illustrated in FIGS. 34 and 35, for example, a silicon oxide film, etc. is deposited on the polysilicon layer 103 by the CVD method to form a gate insulation film 104, and further, an alloy of molybdenum (Mo), niobium (Nb), and tungsten (W) as the first metal layer 105 is deposited thereon by a sputtering method, etc. to form a gate electrode 105a and a holding capacitor electrode 105b. Furthermore, a single layer may be formed of one material selected from a group consisting of Mo, W, Nb, MoW, MoNb, Al, Nd, Ti, Cu, Cu alloy, Al alloy, Ag, and Ag alloy, etc. Alternately, in order to reduce the wiring resistance, it may be formed in one laminate structure selected from a group consisting of a two-layer structure or a multi-layer structure of two or more of Mo, Cu, Al or Ag which are low-resistance material. In this regard, in order to increase the holding capacitance in each sub-pixel, and easily connect the drain of the M1 switch TFT for each sub-pixel with the holding capacitor electrode 105b, the first metal layers 105 are formed in a shape as illustrated in FIGS. 34 and 35. Then, by performing additional impurity doping using the gate electrode 105a as a mask on the polysilicon layer 103 on which a high concentration impurity layer (p+ layer 103c) is doped before forming the gate electrode 105a, a low concentration impurity layer (p– layer 103b) is formed with the i layer 103a interposed therebetween, such that a lightly doped drain (LDD) structure is formed in the TFT part.

Figure 36:
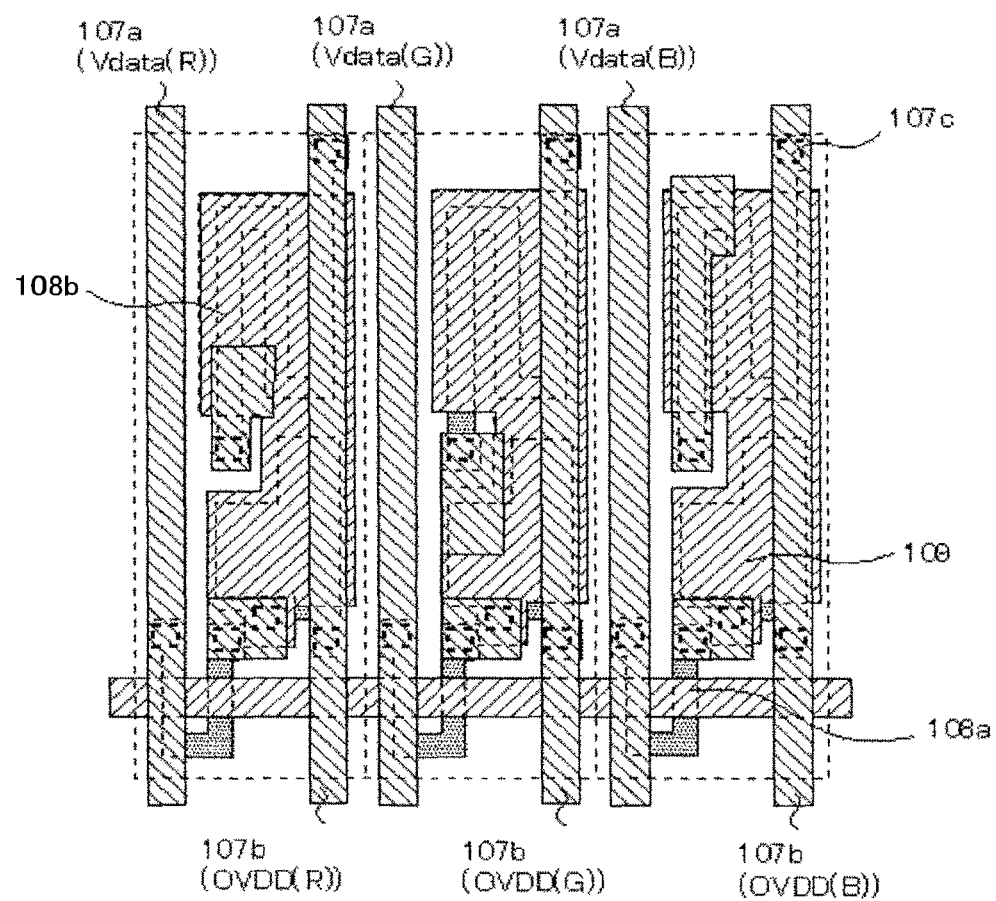
FIG. 36 is a plan view describing the manufacturing process (third process) of the organic EL display apparatus according to the second embodiment of the present invention.
Figure 37:
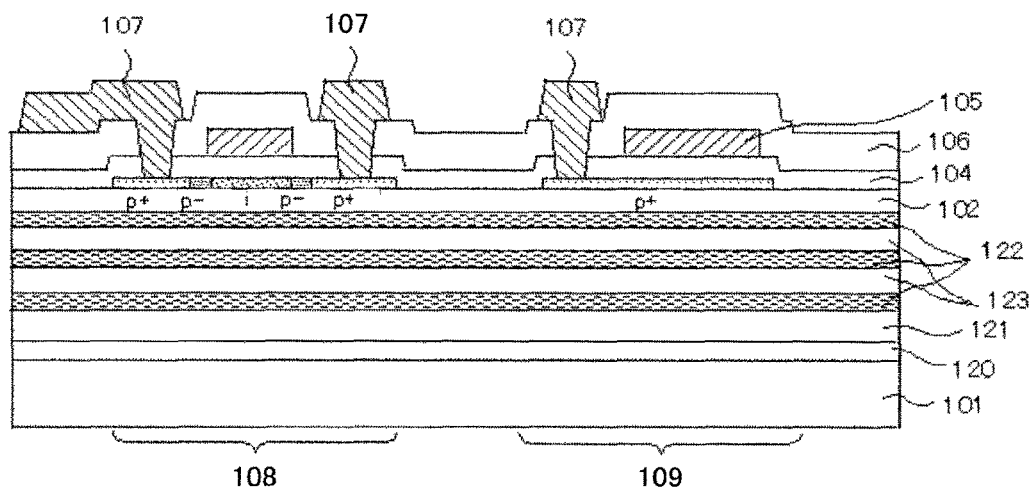
FIG. 37 is a cross-sectional view describing the manufacturing process (third process) of the organic EL display apparatus according to the second embodiment of the present invention.

Next, as illustrated in FIGS. 36 and 37, for example, a silicon oxide film, etc. is deposited thereon by the CVD method, etc. to form an interlayer insulation film 106. Anisotropic etching is performed on the interlayer insulation film 106 and the gate insulation film 104, and contact holes (thick dashed line portions of FIG. 36) are opened for connecting with the polysilicon layer 103. Then, for example, second metal layers 107 of aluminum alloy such as Ti/Al/Ti, etc. are deposited by the sputtering method, etc., and patterning thereof is performed to form the source/drain electrodes, the data line 107a, the power supply line 107b, and the first contact part 107c. Thereby, the data line 107a and the source of the M1 TFT switch, the drain of the M1 switch TFT and the holding capacitor electrode 105b and the gate of the M2 driving TFT, and the source of the M2 driving TFT and the power supply line 107b are connected with each other.

Figure 38:
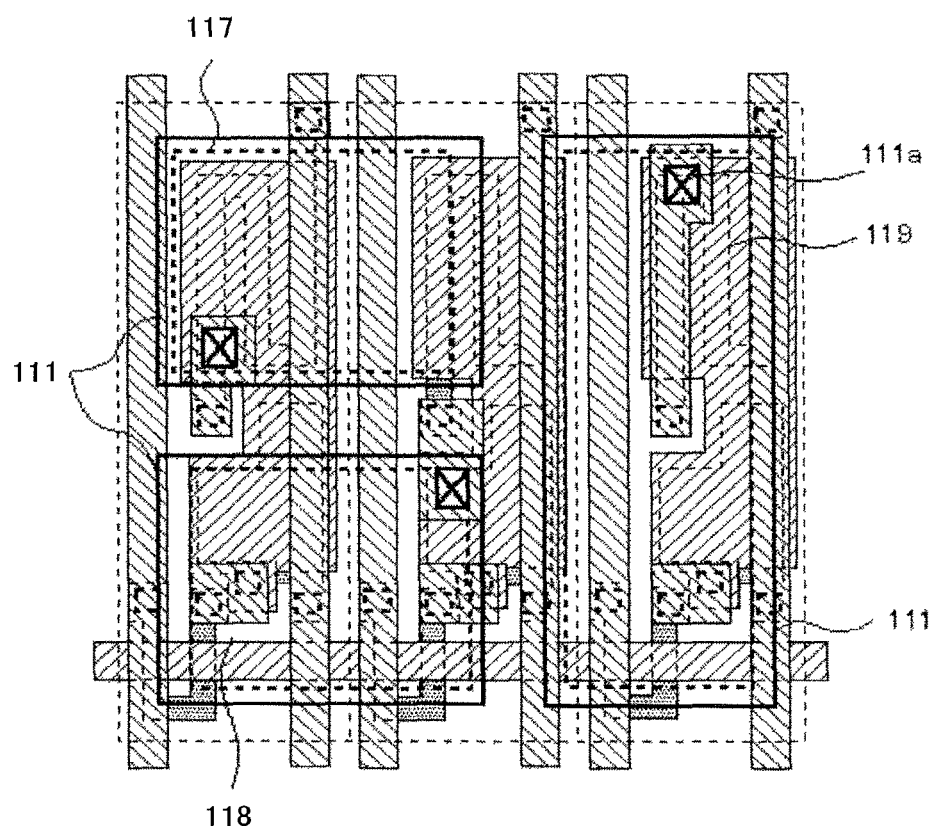
FIG. 38 is a plan view describing the manufacturing process (fourth process) of the organic EL display apparatus according to the second embodiment of the present invention.
Figure 39:
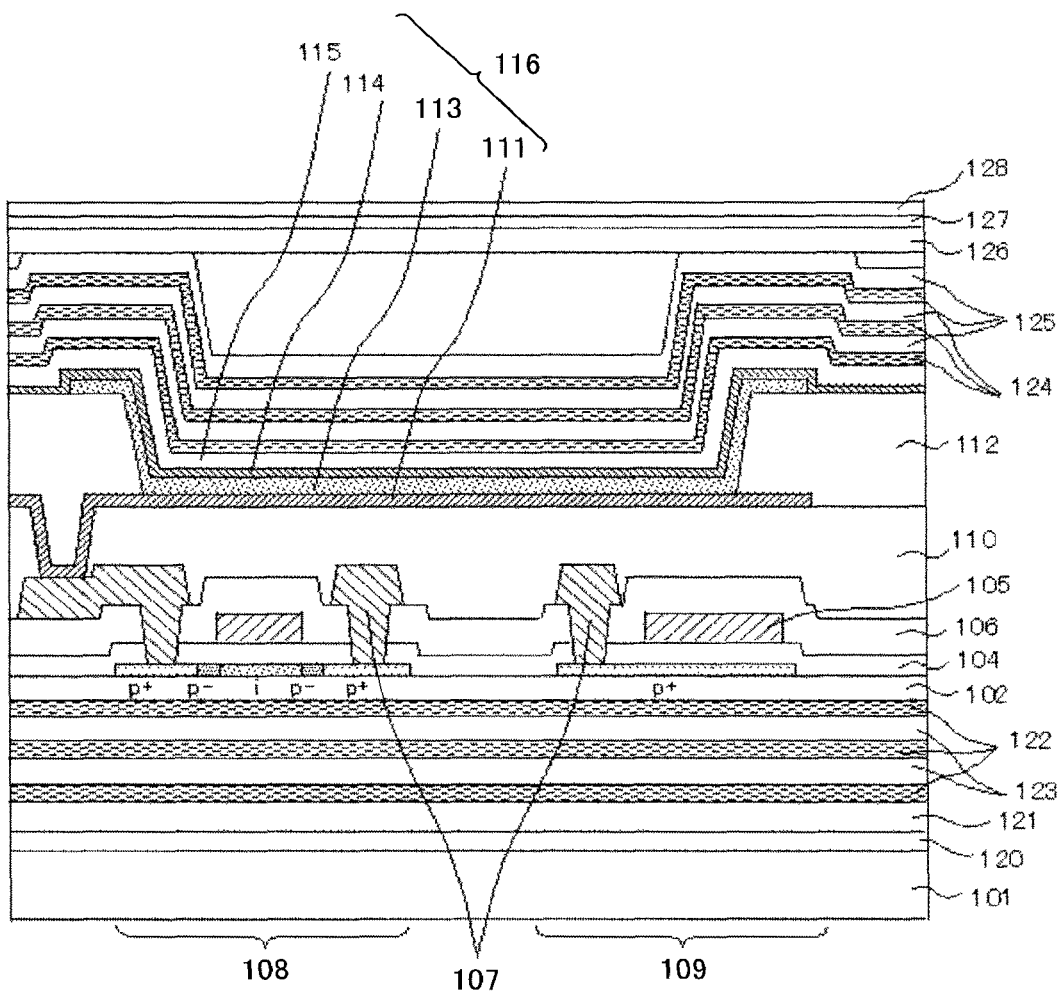
FIG. 39 is a cross-sectional view describing the manufacturing process (fourth process) of the organic EL display apparatus according to the second embodiment of the present invention.

Next, as illustrated in FIGS. 38 and 39, the flattened film 110 is formed by applying a photosensitive organic material. Then, a taper angle is controlled by optimizing the exposure conditions, such that contact holes (thick solid line portions denoted by x marks in FIG. 38) are opened for connecting with the drain of the M2 driving TFT. A reflection film of Ag, Mg, Al, Pt, Pd, Au, Ni, Nd, Ir, Cr and a compound metal thereof is deposited thereon, and then, a transparent film such as ITO, IZO, ZnO or $In_2O_3$, etc. is deposited thereon and simultaneously patterned, to form the anode electrode 111 of each sub-pixel. The anode electrode 111 is connected with the drain of the M2 driving TFT at the second contact part 111a. Further, in the case of the top-emission structure, the anode electrode 111 requires a reflection film to function as a reflection film, but in the case of the bottom-emission structure, the reflection film is eliminated, and only the transparent film such as ITO is formed. Thereafter, for example, a photosensitive organic resin film is applied by a spin coating method, etc. to form the element separation films 112, and patterning thereof is performed to form element isolation layers to which the anode electrode 111 of each sub-pixel is exposed to the bottom. The light emitting regions of the respective sub-pixels are separated from each other by the element isolation layers.

Next, the glass substrate 101 with the element separation film 112 formed thereon is set in a deposition machine, and as necessary, is fixed by aligning a fine metal mask (FMM) having openings formed only in the same color parts as the sub-pixels, or an open mask in which only a display screen area and vicinity thereof are opened, and then an organic material is deposited thereon to form the organic EL layer 113 on the anode electrode 111. The organic EL layer 113 includes, for example, a hole injection layer, a hole transport layer, a light emitting layer, an electron transport layer, an electron injection layer, and the like, which are sequentially formed from a lower layer side. Alternately, the organic EL layer 113 may be any structure of an electron transport layer/emitting layer/hole transport layer, an electron transport layer/emitting layer/hole transport layer/hole injection layer, an electron injection layer/electron transport layer/emitting layer/hole transport layer, or the light emitting layer alone, or may include an electron blocking layer added thereto. The material of the light emitting layer is different for each color of the sub-pixels, and the thickness of the hole injection layer, the hole transport layer, and the like is controlled individually for each sub-pixel, as necessary.

Metal having a small work function, that is, any one of Li, Ca, LiF/Ca, LiF/Al, Al and Mg, or a compound thereof is deposited on the organic EL layer 113 to form the cathode electrode 114. The thickness of the cathode electrode is optimized in order to secure a good viewing angle dependence by improving light extraction efficiency. If the resistance of the cathode electrode is high and uniformity of the light emission luminance is deteriorated, an auxiliary electrode layer is additionally formed thereon of a material for forming a transparent electrode such as ITO, IZO, ZnO or $In_2O_3$, etc. Further, in order to improve the light extraction efficiency, an insulation film having a higher refractive index than the glass is deposited thereon to form the cap layer 115. The cap layer 115 also serves as a protective layer for the organic EL element. Then, an inorganic thin film 124 such as a silicon oxide film or a silicon nitride film and an organic film 125 such as an organic resin are alternately laminated on the cap layer 115 to seal the light emitting element 116. By the above-described processes, the light emitting element 116 corresponding to each sub-pixel of RGB is formed, whereby portions in which the anode electrode 111 and the organic EL layer 113 are in contact with each other (opening portions of the element separation film 112) correspond to the R light emitting region 117, the G light emitting region 118, and the B light emitting region 119, respectively.

Further, when the light emitting element 116 is formed in the bottom-emission structure, the cathode electrode 114 (transparent electrode such as ITO) may be formed on an upper layer of the flattened film 110, and the anode electrode 111 (a reflective electrode) may be formed on the organic EL layer 113. Since it is not necessary to extract the light to an upper surface in the bottom emission structure, a metal layer such as Al may be thickly formed, and since the resistance of the cathode electrode can be greatly decreased, it is suitable for an increase in size. However, since no light is transmitted through a TFT element and a wiring portion, the light emitting region is extremely small, such that it is not suitable for an increase in definition.

Thereafter, the peeling film 120 on the glass substrate 101 is peeled-off by the peeling liquid to remove the glass substrate 101, the film-type touch screen 126 is attached on the uppermost layer film (herein, the organic film 125), and the λ/4 retardation plate 127 and the polarizing plate 128 are attached on the top thereof, to complete the organic EL display apparatus (flexible display section). In this structure, there is no sealing glass substrate for sealing the glass substrate 101 and the light emitting element 116, and the entire organic EL display apparatus is deformable, thereby it is usable in the folding type display apparatus, the electric equipment for various applications using the display apparatus, in particular, the mobile equipment.

Herein, the method for manufacturing the organic EL display apparatus (flexible display section) having the structure illustrated in FIG. 27 has been described, while in the case of the structure illustrated in FIG. 28, the inorganic thin film 124 such as a silicon oxide film or a silicon nitride film and the organic film 125 such as an organic resin are alternately laminated to seal the light emitting element 116, and then the touch screen 126a is formed on the uppermost layer film (herein, the organic film 125). Specifically, a transparent electrode is formed and patterned, an organic film is applied thereon, and a transparent electrode is formed thereon and patterned, thereby forming the touch screen 126a. Then, the λ/4 retardation plate 127 and the polarizing plate 128 are formed thereon. Next, the peeling film 120 on the glass substrate 101 is peeled-off by the peeling liquid, thereby removing the glass substrate 101.

Further, it should be understood that the present invention is not limited to the above-described embodiments and examples, the type and structure of the electro-optical device, the material of each composition, and the manufacturing method may be appropriately modified, without departing from the spirit of the present invention.

For example, FIGS. 32 to 39 illustrate an example of the method for manufacturing the organic EL display apparatus in the present embodiment, and so long as the flexible display section having the foldable structure can be achieved, the manufacturing method thereof is not particularly limited. In addition, when employing the color filter type, a color filter of three colors of R, G and B may be formed on the white organic EL element.

In addition, the electro-optical device of the present invention is not limited to the organic EL display apparatus. Further, the substrate on which the pixels are formed is applicable to not only an active type substrate, but also a passive type substrate. Moreover, in the present invention, the circuit (a so-called 2T1C circuit) including the M1 switch TFT, the M2 driving TFT and the C1 holding capacitor has been exemplified as a circuit for controlling the pixels, but a circuit (for example, 3T1C circuit) including three or more transistors may be employed.

The present invention is applicable to the electro-optical device such as the organic EL display apparatus having the flexible structure, and electric equipment that uses the electro-optical device as the display apparatus, and in particular, the smartphone, the tablet phone and the like.

As this description may be embodied in several forms without departing from the spirit of essential characteristics thereof, the present embodiment is therefore illustrative and not restrictive, since the scope is defined by the appended claims rather than by the description preceding them, and all changes that fall within metes and bounds of the claims, or equivalence of such metes and bounds thereof are therefore intended to be embraced by the claims.

What is claimed is:

1. A folding type display apparatus, comprising:
 a first flexible substrate comprising two laminates, each comprising an inorganic film and an organic film;
 a sheet-shaped display section formed over the first flexible substrate and having flexibility, the sheet-shaped display section including a plurality of organic electro luminescence (EL) elements and a plurality of switching elements;
 a second flexible substrate comprising two laminates, each comprising an inorganic film and an organic film and formed over the sheet-shaped display section; and
 a touch screen formed on the second flexible substrate, wherein
 the inorganic films and the organic films of the two laminates of each of the first flexible substrate and the second flexible substrate are alternately laminated,
 an air layer is formed between the second flexible substrate and the touch screen above each of the organic EL elements, and an uppermost organic film of an uppermost laminate of the second flexible substrate functions as a light extraction layer.

2. The folding type display apparatus according to claim 1,
wherein the plurality of switching elements are formed on the first flexible substrate;
each of the organic EL elements is formed on each of the switching elements respectively; and
the second flexible substrate is formed on the organic EL elements.

3. The folding type display apparatus according to claim 2,
wherein each of the switching elements is a driving Thin Film Transistor (TFT) configured to supply a current corresponding to light emitting gradation to each of the organic EL elements respectively.

4. The folding type display apparatus according to claim 3,
wherein conductance of each of the driving TFTs is changed in an analog manner during suppling the current.

5. The folding type display apparatus according to claim 1,
wherein the uppermost organic film of the uppermost laminate of the second flexible substrate is in contact with the touch screen above an element for separating the plurality of organic EL elements, and
light emitted from the plurality of organic EL elements passes through the air layer and exits outside.

6. The folding type display apparatus according to claim 1,
wherein surfaces of the plurality of organic EL elements are parallel to a surface of the touch screen.

7. The folding type display apparatus according to claim 1,
wherein an optical characteristic is uniform in an area where light emitted from the plurality of organic EL elements exits outside.

8. The folding type display apparatus according to claim 1,
wherein the air layer is maintained without being collapsed when the folding type display apparatus is folded.

* * * * *